US008749528B2

(12) United States Patent
Imai et al.

(10) Patent No.: US 8,749,528 B2
(45) Date of Patent: Jun. 10, 2014

(54) DISPLAY DEVICE

(75) Inventors: Hajime Imai, Osaka (JP); Takuya Watanabe, Osaka (JP); Atsuhito Murai, Osaka (JP); Hideki Kitagawa, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 365 days.

(21) Appl. No.: 13/379,783

(22) PCT Filed: Feb. 26, 2010

(86) PCT No.: PCT/JP2010/053074
§ 371 (c)(1),
(2), (4) Date: Dec. 21, 2011

(87) PCT Pub. No.: WO2010/150573
PCT Pub. Date: Dec. 29, 2010

(65) Prior Publication Data
US 2012/0092302 A1    Apr. 19, 2012

(30) Foreign Application Priority Data

Jun. 25, 2009  (JP) ................................ 2009-150450

(51) Int. Cl.
*G06F 3/042* (2006.01)
(52) U.S. Cl.
USPC ....................................................... 345/175
(58) Field of Classification Search
None
See application file for complete search history.

(56) References Cited

U.S. PATENT DOCUMENTS

| 6,995,753 | B2 * | 2/2006 | Yamazaki et al. | 345/204 |
| 7,773,068 | B2 * | 8/2010 | Nakamura et al. | 345/104 |
| 8,097,927 | B2 * | 1/2012 | Tai et al. | 257/431 |
| 2008/0164473 | A1 | 7/2008 | Tai et al. | |
| 2009/0085135 | A1 * | 4/2009 | Bang | 257/432 |
| 2009/0152603 | A1 * | 6/2009 | Kim | 257/292 |
| 2010/0231562 | A1 | 9/2010 | Brown | |

FOREIGN PATENT DOCUMENTS

| GB | 2439098 A | 12/2007 |
| JP | 2008-171871 A | 7/2008 |
| JP | 2009-093050 A | 4/2009 |
| WO | 2007/145347 A1 | 12/2007 |

* cited by examiner

*Primary Examiner* — Jason Olson
(74) *Attorney, Agent, or Firm* — Chen Yoshimura LLP

(57) ABSTRACT

A display panel of an organic EL display device includes a photo-detection section that detects reflected light when a screen is touched by a finger or the like. The photo-detection section includes a photodiode that receives the reflected light, and an output amplifier that outputs an output voltage corresponding to the amount of the received light. If an a-Si diode is used for such a photodiode, a sufficiently large signal difference between the bright state and the dark state can be achieved. Also, if a p-Si amplifier is used for the output amplifier, the output voltage becomes the saturation voltage at the time of read-out. This allows the p-Si amplifier to directly output the large difference detected by the a-Si diode as a large difference in the output voltage.

7 Claims, 14 Drawing Sheets

(A)

(B)

(C)

(A)

(B)

(A)

(B)

| First pixel forming section | | | Second pixel forming section | | | Third pixel forming section | | |
|---|---|---|---|---|---|---|---|---|
| R | G | B | R | G | B | R | G | B |
| 41a-1 | 43-1 | 42-1 | 41a-2 | 43-2 | 42-2 | 41a-3 | 43-3 | 42-3 |

DISPLAY DEVICE

TECHNICAL FIELD

The present invention relates to a display device, and more particularly, a display device equipped with a display panel having a plurality of photo-detection sections.

BACKGROUND ART

In recent years, electronic devices that are equipped with an organic EL (Electro Luminescence) display panel and that perform an operation when an operator touches a screen displayed thereon with a finger, a pen, or the like have been spreading widely. In the display panel of such an electronic device, photo-detection sections that detect an amount of light reflected by a finger or the like are disposed in a matrix so as to detect a touch position of a finger, a pen, or the like. The electronic device detects a touch position on the screen based on the amount of light detected by the photo-detection sections disposed in the display panel, and conducts an operation desired by an operator.

In relation to this, the WO 2007/145347 pamphlet discloses a liquid crystal display panel that includes photo-detection sections each having a photodiode and disposed for each pixel. The photo-detection section includes a photodiode that generates electric charges corresponding to incident light, a capacitor that accumulates the electric charges generated in the photodiode, and a TFT (Thin Film Transistor) that acts as an output amplifier. The operation of the photo-detection section will be later described in detail, but when light reflected by a finger or the like is incident on the photodiode, electric charges corresponding to the light amount are generated in the photodiode, and the generated electric charges are accumulated in the capacitor, thereby lowering a voltage retained by the capacitor by an amount corresponding to the amount of the accumulated electric charges. When the voltage retained by the capacitor is applied to a gate terminal of the TFT, the TFT outputs a voltage that is lower than the voltage retained by the capacitor by the threshold voltage. In this way, the photo-detection section outputs a voltage corresponding to the light amount, and therefore, the liquid crystal display device can obtain the coordinate of a touch position on the screen based on the output voltage of the photo-detection section.

RELATED ART DOCUMENTS

Patent Documents

Patent Document 1: WO2007/145347 pamphlet

SUMMARY OF THE INVENTION

Problems to be Solved by the Invention

In such a photo-detection section, the following characteristics are required for the photodiode and the TFT (output amplifier), respectively, to improve the accuracy of detecting a touch position on the screen. With respect to the photodiode, it is required to have a high sensitivity to visible light. With respect to the output amplifier, it is required to have a large difference in output voltages between when light is incident on the photodiode and when there is no incident light, and it is also required that the output voltage have been saturated at the time of read-out. These characteristics greatly depend on materials of the photodiode and the output amplifier. However, the WO 2007/145347 pamphlet provides no description or suggestion with regard to the materials of those elements. This causes a problem in that, if the photodiode and the output amplifier are not made of the materials best suited for the respective elements, the touch position detection accuracy of the photo-detection section is lowered.

It is an object of the present invention to provide a display device equipped with a display panel that includes photo-detection sections that can detect a touch position with a higher degree of accuracy.

Means for Solving the Problems

A first aspect of the present invention is a display device that is capable of detecting a touch position, including a display panel including a plurality of image display sections that display an image at a brightness corresponding to image data, and a plurality of photo-detection sections that generate a signal corresponding to an amount of received light, a display driver circuit that writes a signal corresponding to the image data in the image display sections, and a sensor driver circuit that reads the signal corresponding to the amount of received light from the photo-detection sections, wherein each of the photo-detection sections includes a photodiode that generates electric charges corresponding to an incident light amount, a capacitor that accumulates the electric charges generated in the photodiode and that retains a voltage corresponding to the accumulated electric charge amount, and a thin film transistor that outputs an output signal based on the voltage retained by the capacitor, wherein the photodiode is made of a semiconductor film having a higher photosensitivity than that of a semiconductor film included in the thin film transistor, and wherein the thin film transistor is made of a semiconductor film having a higher mobility than that of the semiconductor film included in the photodiode.

A second aspect of the present invention is the first aspect of the present invention, wherein the semiconductor film included in the photodiode is an amorphous semiconductor film, and wherein the semiconductor film included in the thin film transistor is a polycrystalline semiconductor film.

A third aspect of the present invention is the first aspect of the present invention, wherein the display panel includes a first substrate and a second substrate that are bonded to face each other, wherein the thin film transistor is formed on the first substrate and the photodiode is formed on the second substrate, and wherein the thin film transistors and the photodiodes are electrically connected by a conductive connecting member formed between the first substrate and the second substrate.

A fourth aspect of the present invention is the third aspect of the present invention, wherein the connecting member includes a columnar portion made of an insulating material and a first conductive film formed on a surface of the columnar portion, and wherein the columnar portion maintains a predetermined distance between the first substrate and the second substrate by its height.

A fifth aspect of the present invention is the first aspect of the present invention, wherein the aforementioned image display section includes a display element, part of which is formed of a second conductive film made of the same material as that of the first conductive film.

A sixth aspect of the present invention is the first aspect of the present invention, wherein the image display section includes three sub-pixels that display images in red, green, and blue, respectively, and wherein the three sub-pixels respectively include the aforementioned photodiode, the aforementioned thin film transistor, and the aforementioned capacitor.

A seventh aspect of the present invention is the first aspect of the present invention, wherein the photodiode is a thin film transistor in which a control terminal and one of conductive terminals constitute an anode terminal and the other conductive terminal is a cathode terminal.

An eighth aspect of the present invention is the first aspect of the present invention, wherein the aforementioned display panel is an organic EL display panel.

A ninth aspect of the present invention is the first aspect of the present invention, wherein the aforementioned display panel is a liquid crystal display panel.

Effects of the Invention

According to the first aspect of the present invention, by constructing the photodiode from a semiconductor film having a higher photosensitivity than that of a semiconductor film included in the thin film transistor, the difference in output of the photodiode between the bright state and the dark state can be increased. Also, the semiconductor film included in the thin film transistor has a higher mobility than that of the semiconductor film included in the photodiode, which allows an output signal to be saturated in a shorter period of time. Consequently, the photo-detection section can directly output the large difference between the bright state and the dark state detected by the photodiode. This makes it possible for the display device to detect a touch position on a screen displayed on the display panel with a high degree of accuracy. Also, because the photodiode including the semiconductor film having the high photosensitivity has the larger difference in the output current between the bright state and the dark state as compared with a photodiode including a semiconductor film having a low photosensitivity, a light receiving time can be shortened when a part of this large difference is taken into account in setting the light receiving time. This allows read-out intervals to be shortened, and the sensor frequency of the photo-detection section can therefore be increased. Further, the large current difference between the bright state and the dark state of the photodiode including the semiconductor film having a high photosensitivity can be utilized to lower a read-out voltage that is output from the sensor driver circuit, thereby leading to the reduction of the power consumption in the display device.

According to the second aspect of the present invention, the photodiode is made of an amorphous semiconductor film, and therefore, the photosensitivity of the photodiode becomes higher than that of a photodiode made of a polycrystalline semiconductor film. Also, the thin film transistor is made of a polycrystalline semiconductor film that has a higher mobility than that of an amorphous semiconductor film. Thus, the same effects as the first aspect of the invention can be obtained.

According to the third aspect of the present invention, the thin film transistor made of the polycrystalline semiconductor film is formed in the first substrate, and the photodiode made of the amorphous semiconductor film is formed in the second substrate. This makes it easier to manufacture the first substrate and the second substrate, respectively. Also, because the first substrate and the second substrate are electrically connected by a conductive connecting member interposed therebetween, the thin film transistor and the photodiode can be electrically connected with ease. Therefore, the display panel capable of detecting a touch position with a higher degree of accuracy can be manufactured with ease.

According to the fourth aspect of the present invention, the connecting member includes a columnar portion made of an insulating material, which maintains a constant distance between the first substrate and the second substrate by its height. This means that the connecting member not only electrically connects the first substrate and the second substrate, but also acts as a spacer that maintains a predetermined distance between the first substrate and the second substrate.

According to the fifth aspect of the present invention, the first conductive film covering the columnar portion of the connecting member is made of the same material as that of the second conductive film included in the display element of the image display section. This allows these films to be formed simultaneously in the manufacturing process of the display panel, resulting in the simpler manufacturing process, and hence the lower manufacturing cost.

According to the sixth aspect of the present invention, the photodiode, the thin film transistor, and the capacitor, which constitute the photo-detection section, are respectively disposed in red, green, and blue sub-pixels, which constitute an image forming section, and therefore, one photo-detection section can be disposed in every image forming section. In this case, a large number of photo-detection sections can be disposed in the display panel, resulting in the higher density of the photo-detection sections. Consequently, a touch position can be detected with a high degree of detection accuracy.

According to the seventh aspect of the present invention, the photodiode included in the photo-detection section is a thin film transistor with a diode connection, and therefore, the output characteristic thereof is not likely to be affected by variation in the manufacturing process. For this reason, the display device including a plurality of photo-detection sections can detect a touch position with a high degree of accuracy.

According to the eighth aspect of the present invention, the display device equipped with an organic EL display panel can detect a touch position on a screen displayed on the organic EL display panel with a high degree of accuracy.

According to the ninth aspect of the present invention, the display device equipped with a liquid crystal display panel can detect a touch position on a screen displayed on the liquid crystal display panel with a high degree of accuracy.

DETAILED DESCRIPTION OF EMBODIMENTS

Hereinafter, one embodiment of the present invention will be described with reference to accompanying drawings.

1. Configuration of Organic EL Display Device

Figure 1:
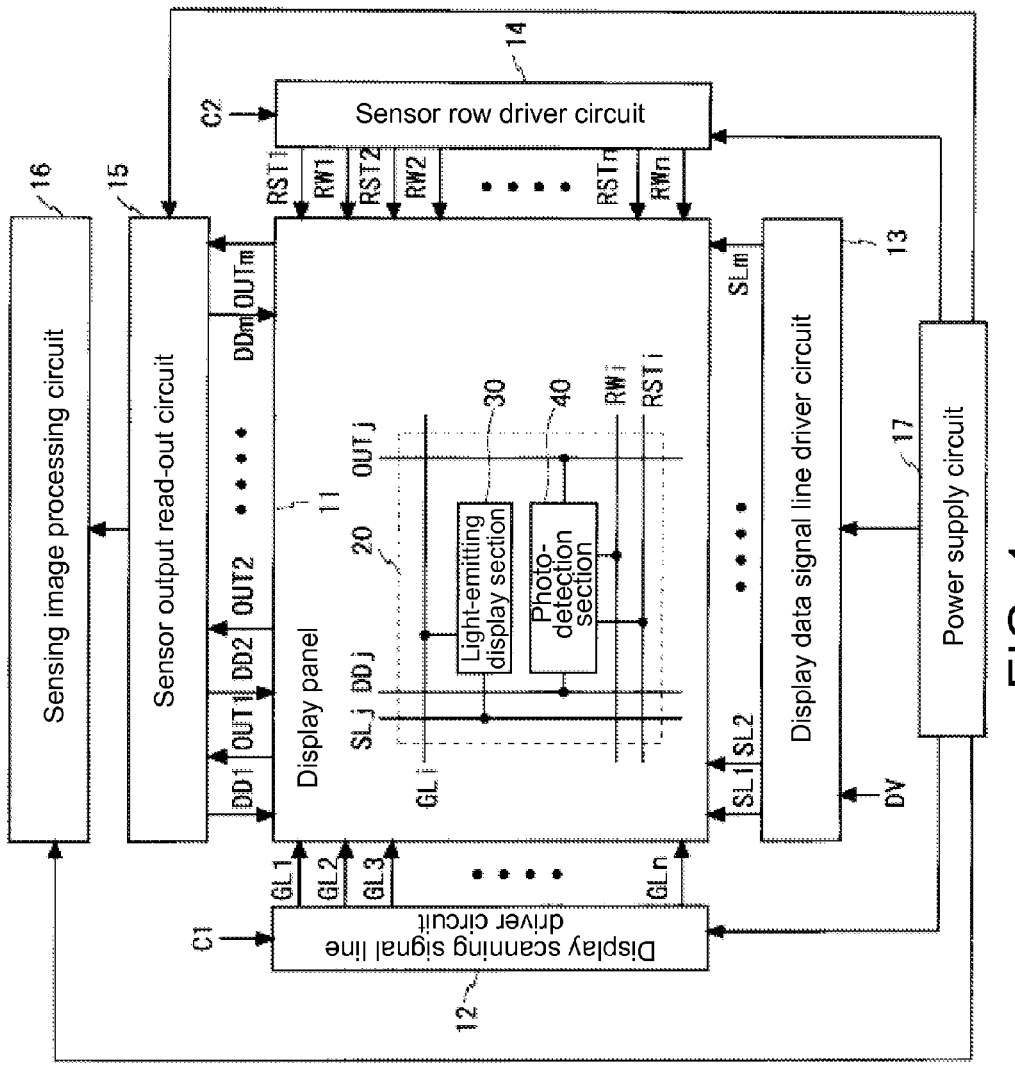
FIG. 1 is a block diagram showing a configuration of an organic EL display device according to an embodiment of the present invention.

FIG. 1 is a block diagram showing a configuration of an organic EL display device 10 according to one embodiment of the present invention. The organic EL display device 10 shown in FIG. 1 includes a display panel 11, a display scanning signal line driver circuit 12, a display data signal line driver circuit 13, a sensor row driver circuit 14, a sensor output read-out circuit 15, a sensing image processing circuit 16, and a power supply circuit 17.

The display panel 11 includes: n number of scanning signal lines GL1 to GLn, sensor read-out lines RW1 to RWn, and sensor reset lines RST1 to RSTn; m number of data signal lines SL1 to SLm, sensor output lines OUT1 to OUTm, and power supply lines DD1 to DDm; and (n×m) number of pixel forming sections 20.

The n number of scanning signal lines GL1 to GLn are arranged in parallel with each other in the horizontal direction. The m number of data signal lines SL1 to SLm are arranged in parallel with each other so as to be perpendicular to the scanning signal lines GL1 to GLn. The sensor read-out lines RW1 to RWn and the sensor reset lines RST1 to RSTn are arranged in parallel with the scanning signal lines GL1 to GLn, respectively. The sensor output lines OUT1 to OUTm and the power supply lines DD1 to DDm are arranged in parallel with the data signal lines SL1 to SLm, respectively.

A pixel forming section 20 is disposed in the vicinity of each intersection of the scanning signal lines GL1 to GLn and the data signal lines SL1 to SLm. The pixel forming sections 20 are arranged in a matrix as a whole, with n number of them arranged in the column direction (vertical direction in the figure), and m number of them arranged in the row direction (horizontal direction in the figure). Each pixel forming section 20 includes a light-emitting display section 30 for displaying an image and a photo-detection section 40 for detecting a touch position.

The display scanning signal line driver circuit 12 selects, in every one line period, one scanning signal line from the scanning signal lines GL1 to GLn according to a timing control signal C1 and applies a high-level voltage to the selected scanning signal line and a low-level voltage to the scanning signal lines that were not selected. The display data signal line driver circuit 13 stores image data DV received from the outside for at least one row at a time and supplies, in every one line period, electric currents that correspond to the image data DV for one row to the data signal lines SL1 to SLm. As a result, the light-emitting display section 30 included in the pixel forming section 20 emits light at the brightness determined according to the electric current that corresponds to the image data DV, and an image is thereby displayed on the display panel 11.

The sensor row driver circuit 14 selects, in every one line period, one signal line each from the n number of sensor read-out lines RW1 to RWn and from the n number of sensor reset lines RST1 to RSTn according to a timing control signal C2. A read-out voltage and a reset voltage of the prescribed value are applied to the selected sensor read-out line and sensor reset line, respectively. The signal lines that were not selected receive a voltage different from when they are selected.

The sensor output read-out circuit 15 supplies a power supply voltage to the photo-detection sections 40 via the power supply lines DD1 to DDm and determines amounts of light incident on the photo-detection sections 40 according to output voltages output from the photo-detection sections 40 via the sensor output lines OUT1 to OUTm. The sensing image processing circuit 16 obtains the coordinate of a touch position on a screen displayed on the display panel 11 according to the light amount of each photo-detection section 40 provided by the sensor output read-put circuit 15.

The power supply circuit 17 supplies required power supply voltages to the display scanning signal line driver circuit 12, the display data signal line driver circuit 13, the sensor row driver circuit 14, the sensor output read-out circuit 15, and the sensing image processing circuit 16.

The sensing image processing circuit 16 may be a circuit formed of an integrated circuit, or may be a personal computer in which an image processing software has been installed. In the explanations above, the respective circuits have been described as individual circuits that are separately provided, but a circuit configured by appropriately combining these circuits may also be used. The display scanning signal line driver circuit 12 and the display data signal line driver circuit 13 may also be collectively referred to as a display driver circuit, and the sensor row driver circuit 14 and the sensor output read-out circuit 15 may also be collectively referred to as a sensor driver circuit.

2. Configuration and Operation of Light-Emitting Display Section

Figure 2:
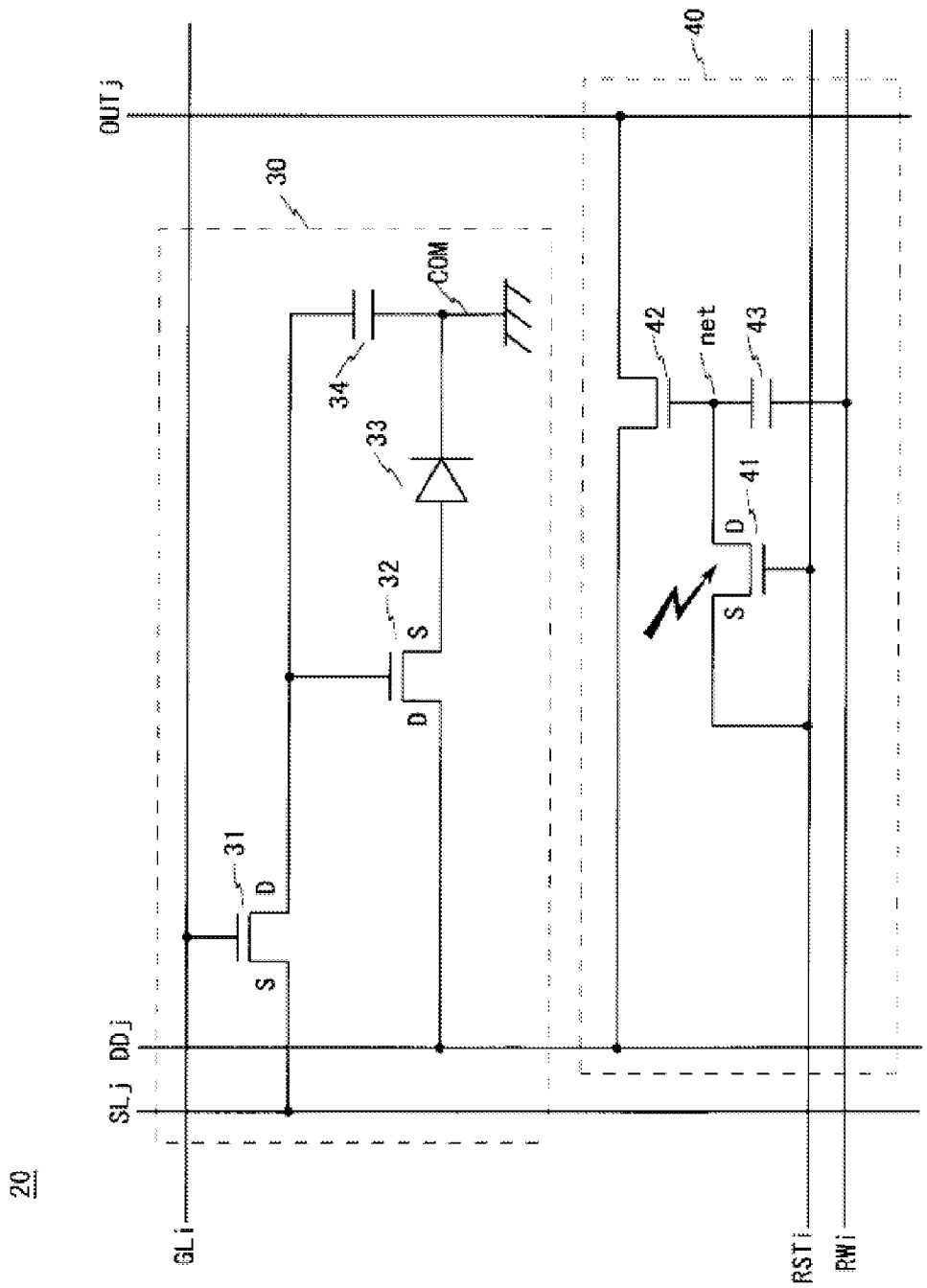
FIG. 2 is a circuit diagram showing an equivalent circuit of a pixel forming section disposed in a display panel included in the organic EL display device illustrated in FIG. 1.

FIG. 2 is a circuit diagram showing an equivalent circuit of the pixel forming section 20 disposed in the display panel 11 of the organic EL display device 10 illustrated in FIG. 1. As shown in FIG. 2, the pixel forming section 20 includes the light-emitting display section 30 for displaying an image at a brightness corresponding to image data DV, and the photo-detection section 40 for determining an amount of light reflected by a finger or the like that touched a screen. When the screen is touched by a finger, light emitted by the light-emitting display section 30 for displaying an image on the display panel 11 is reflected by the finger and thereby incident on the photo-detection section 40. The photo-detection section 40 detects the incident light amount, and the organic EL display device 10 obtains the coordinates of the position on the screen touched by the finger based on the change in the light amount that has been detected.

First, the light-emitting display section 30 will be explained. The light-emitting display section 30 includes an organic EL element 33, a capacitor 34, an n-channel type TFT 32 that acts as a controller TFT (hereinafter referred to as a "controller TFT 32"), and an n-channel type TFT 31 that acts as a selector TFT (hereinafter referred to as a "selector TFT 31"). The controller TFT 32 is a TFT that controls a level of a voltage to be applied to the organic EL element 33. The selector TFT 31 is a TFT that controls the timing to apply an electric current to the organic EL element 33. The organic EL element 33, which is also referred to as a display element, is an OLED (Organic Light-Emitting Diode) that includes a light-emitting layer made of an organic compound and that emits light by excitons generated from the recombination of electrons and holes injected to the light-emitting layer.

The gate terminal and the source terminal of the selector TFT 31 are connected to the i-th scanning signal line GLi ("i" is an integer from 1 to n inclusive) and the j-th data signal line SLj ("j" is an integer from 1 to m inclusive), respectively. The drain terminal of the selector TFT 31 is connected to one electrode of the capacitor 34 whereas the other electrode of the capacitor 34 is grounded via a common voltage supply line COM. The gate electrode of the controller TFT 32 is connected to the connection point between the drain terminal of the selector TFT 31 and the one electrode of the capacitor 34. The drain terminal and the source terminal of the controller TFT 32 are connected to the j-th power supply line DDj and the anode terminal of the organic EL element 33, respectively. The cathode terminal of the organic EL element 33 is connected to the other electrode of the capacitor 34 that is grounded. Here, FIG. 2 shows the light-emitting display section 30 of the simplest configuration so that the operation of the light-emitting display section of the embodiment of the present invention can be explained with ease. However, circuits of any other configurations may be employed as the light-emitting display section 30 of the present embodiment as long as it drives the organic EL element 33 to emit light at a brightness corresponding to image data DV.

Next, the operation of the light-emitting display section 30 will be explained. During a period in which the selector TFT 31 is selected by a scanning signal applied to the scanning signal line GLi, an electric current corresponding to the image data DV flows from the data signal line SLj to the capacitor 34 via the selector TFT 31, thereby charging the capacitor 34. The charged capacitor 34 retains the voltage corresponding to the image data DV during a period in which the selector TFT 31 is not selected. Therefore, even during the period in which the selector TFT 31 is not selected, the voltage retained by the capacitor 34 is applied to the gate terminal of the controller TFT 32. Because the drain terminal of the controller TFT 32 receives a voltage Vdd of +15V from the power supply line DDj as described below, the controller TFT 32 outputs a voltage that is lower by the threshold voltage than the voltage applied to the gate terminal. The voltage output to the source terminal of the controller TFT 32 is applied to the anode terminal of the organic EL element 33. The voltage applied to the anode terminal of the organic EL element 33 is a voltage that changes according to the image data DV, and therefore, an electric current flowing into the organic EL element 33 also changes according to the image data DV. Thus, the organic EL element 33 emits light at a brightness determined according to the image data DV, and an image corresponding to the image data DV is therefore displayed on the display panel 11.

3. Configuration and Operation of Photo-Detection Section

Next, the photo-detection section 40 of the pixel forming section 20 will be explained. As shown in FIG. 2, the photo-detection section 40 includes an n-channel type TFT 41 (also referred to as a "photodiode 41") that acts as a photodiode and that generates electric charges corresponding to an incident light amount, a capacitor 43 that accumulates the electric charges generated in the TFT 41 and that retains a voltage corresponding to an amount of the accumulated electric charges, and an n-channel type TFT 42 (also referred to as an "output amplifier 42") that acts as an output amplifier and that outputs an output voltage corresponding to the voltage retained by the capacitor 43.

The drain terminal and the source terminal of the output amplifier 42 are connected to the j-th power supply line DDj and the j-th sensor output line OUTj, respectively. The gate terminal of the output amplifier 42 is connected to one electrode of the capacitor 43, and the other electrode of the capacitor 43 is connected to the i-th sensor read-out line RWi. The drain terminal of the TFT 41 that acts as a cathode terminal of the photodiode is connected to the connection point (hereinafter referred to as a node "net") between the gate terminal of the output amplifier 42 and one electrode of the capacitor 43. The source terminal and the gate terminal of the TFT 41 that act as the anode terminal are connected to the i-th sensor reset RSTi line. Because the TFT 41 acts as a photodiode, the TFT 41 may be referred to as a photodiode 41, the drain terminal thereof may be referred to as a cathode terminal, and the source terminal and the gate terminal thereof may be collectively referred to an anode terminal.

Figure 3:
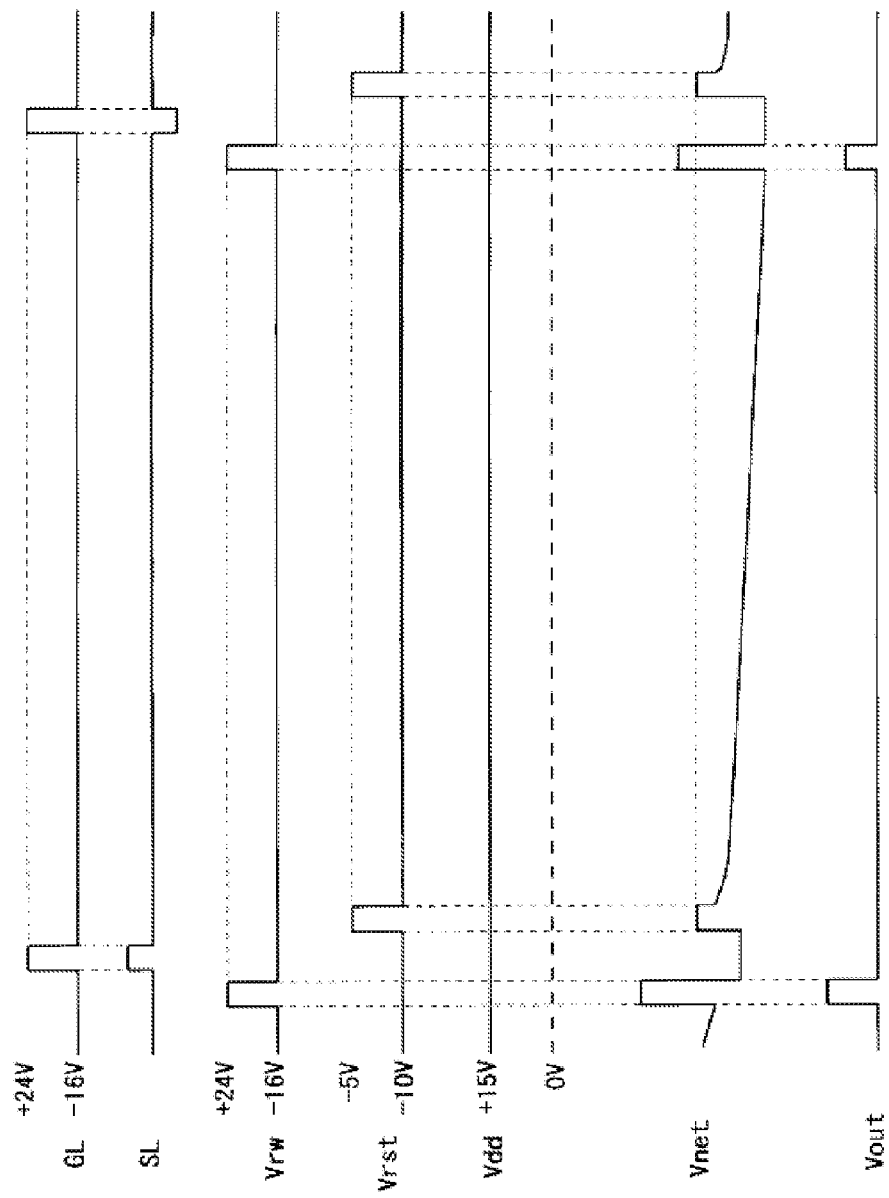
FIG. 3 is a timing chart showing an operation of a photo-detection section included in the organic EL display device illustrated in FIG. 1.

Next, the operation of the photo-detection section 40 will be explained. FIG. 3 is a timing chart showing the operation of the photo-detection section 40. As shown in FIG. 3, first, a voltage Vrst that is applied to the sensor reset line RSTi is raised from −10V to −5V. At this time, in the photodiode 41, the cathode terminal thereof is supplied with a voltage lower than −5V, and the voltage −5V from the sensor reset line RSTi is applied to the anode terminals thereof. The photodiode 41 thus becomes forward-biased and conducts. As a result, a voltage Vnet of the node "net" rises to a value that is lower than the voltage Vrst applied to the anode terminals by the amount of voltage decreased due to the ON resistance of the photodiode 41. In this case, because the ON resistance of the photodiode 41 is small, the voltage Vnet of the node "net" rises to almost −5V. This resets the voltage Vnet of the node "net." After that, when the voltage Vrst applied to the sensor reset line RSTi is lowered from −5V to −10V, −10V is applied to the anode terminal of the photodiode 41, and consequently, the photodiode 41 becomes reverse-biased.

Next, when light reflected by a finger that touched the screen of the display panel 11 is incident on the photodiode 41, pairs of electrons and holes are generated in the photodiode 41 corresponding to the incident light amount. Of the electrons and the holes generated in the photodiode 41, the electrons (hereinafter referred to as "electric charges") are transferred to the capacitor 43 by the reverse-bias voltage applied to the photodiode 41 and are accumulated in the capacitor 43. Therefore, the capacitor 43 retains a voltage corresponding to the amount of electric charges accumulated therein. In this case, as the amount of incident light increases, the amount of electric charges generated in the photodiode 41 increases, thereby increasing the amount of electric charges accumulated in the capacitor 43. As a result, the voltage at the capacitor 43 or the voltage Vnet of the node "net" is further decreased. On the other hand, when the screen of the display panel 11 is not touched, no light is reflected by a finger, and therefore, no light is incident on the photodiode 41, thereby generating no electric charge in the photodiode 41. In this case, because no electric charge is accumulated in the capacitor 43, the voltage Vnet of the node "net" remains almost −5V, which is the voltage after resetting.

Next, after a predetermined time has passed and when a read-out operation for the photo-detection section 40 starts, a voltage Vrw applied to the sensor read-out line RWi is raised from −16V to +24V. In this case, a voltage applied to the other electrode of the capacitor 43 that is connected to the sensor read-out line RWi is also raised from −16V to +24V, which causes a large increase in the voltage of the one electrode of the capacitor 43, i.e., the voltage Vnet of the node "net." The level of the increased voltage Vnet at the node "net" is determined by the amount of the electric charges accumulated in the capacitor 43 from the time of reset to the time of read-out, and as the amount of the accumulated electric charges increases, the voltage at the node "net" lowers. On the other hand, a voltage Vdd of +15V is applied to the power supply line DDj, thereby supplying the voltage Vdd of +15V to the drain terminal of the output amplifier 42. Therefore, the source terminal of the output amplifier 42 outputs a voltage Vout that is lower by the threshold voltage than the voltage Vnet of the node "net" applied to the gate terminal. In the photo-detection section 40 configured in a manner described above, as the amount of light incident on the photodiode 41 increases, the voltage Vnet at the node "net" becomes lower, and accordingly, the output voltage Vout output to the sensor output line OUTj becomes lower.

The sensor output read-out circuit 15 obtains the amount of light detected by the photo-detection section 40 based on the output voltage Vout that was output to the sensor output line OUTj. Further, the sensing image processing circuit 16 determines the coordinate data of a touch position on the screen based on the detected light amount.

Conventionally, a PIN diode made of polycrystalline silicon has been often used as the photodiode in the photo-detection section 40. However, in the embodiment of the present invention, a photodiode made of amorphous silicon is formed on an opposite substrate. In this case, if a PIN diode made of amorphous silicon is to be formed as such a photodiode, it leads to a problem of the higher manufacturing cost, the lower yield, and the like due to the complex structure which requires more steps in the manufacturing process. For this reason, instead of a PIN diode, the TFT 41 in which a source terminal and a gate terminal are connected (may also be referred to as "diode-connection" hereinafter) is used as a photodiode made of amorphous silicon.

4. Materials and Electric Characteristics of Photodiode and Sensor Preamplifier

Figure 4:
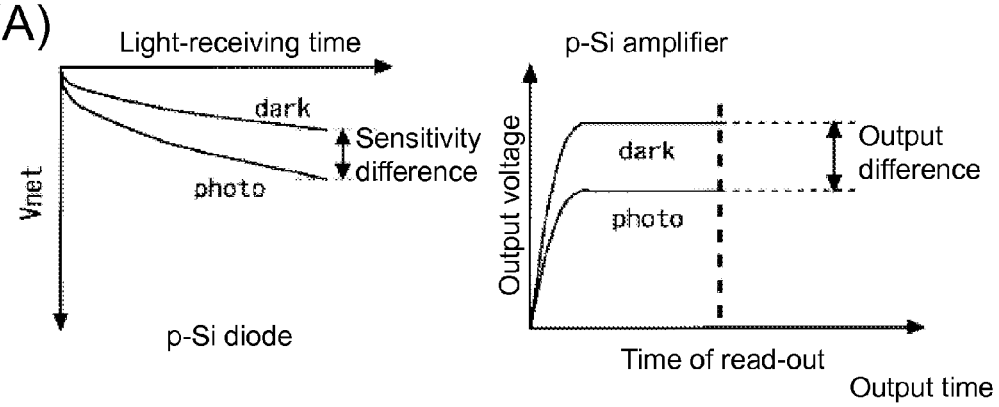
FIG. 4(A) shows diagrams illustrating characteristics of a photodiode and an output amplifier that are made of polycrystalline silicon.
FIG. 4(B) shows diagrams illustrating characteristics of a photodiode and an output amplifier that are made of amorphous silicon.
FIG. 4(C) shows diagrams illustrating characteristics of a photodiode made of amorphous silicon and an output amplifier made of polycrystalline silicon.
Figure 4:
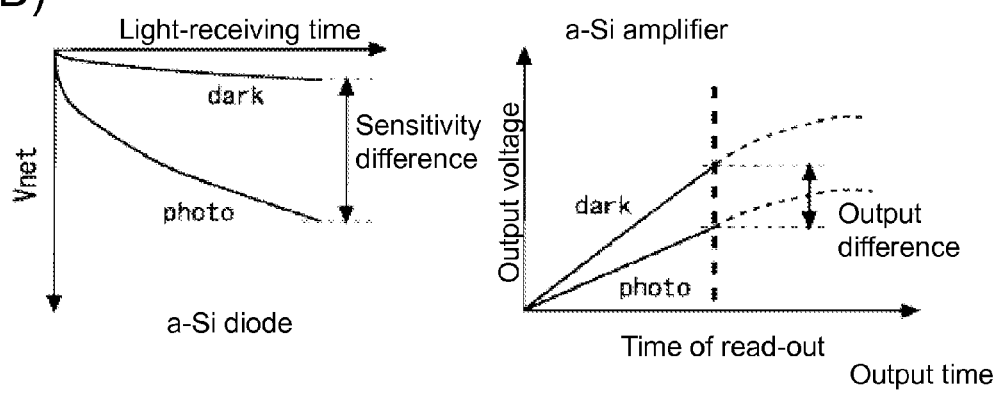
Figure 4:
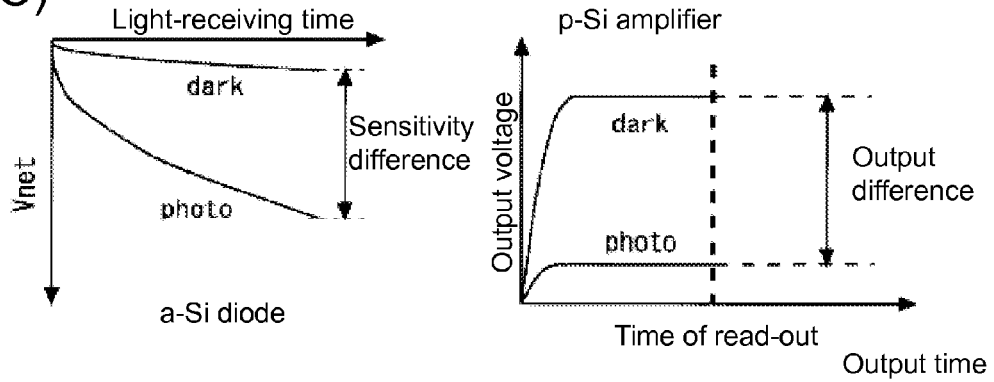

A relationship between characteristics and materials of the photodiode 41 and the output amplifier 42 in the bright state (when light is incident on the photodiode) and in the dark state (when no light is incident on the photodiode) will be explained. FIG. 4(A) shows characteristics of the photodiode 41 and the output amplifier 42 that are made of polycrystalline silicon. FIG. 4(B) shows characteristics of the photodiode 41 and the output amplifier 42 that are made of amorphous silicon. FIG. 4(C) shows characteristics of the photodiode 41 made of amorphous silicon and the output amplifier 42 made of polycrystalline silicon.

In the photodiode 41 made of polycrystalline silicon (may also be referred to as a "p-Si diode" hereinafter), as shown in FIG. 4(A), the amount of electric charges generated in the photodiode 41 when light is incident thereon is only slightly greater than the amount of electric charges generated when there is no incident light. Therefore, the difference in the voltage Vnet of the node "net" between the bright state and the dark state is small. This means the sensitivity of the p-Si diode for the bright state and the dark state is low. On the other hand, in the output amplifier 42 made of polycrystalline silicon (may also be referred to as a "p-Si amplifier" hereinafter), the difference in the output voltage between the bright state and the dark state is small, but the output voltage has become a saturation voltage at the time of read-out. Therefore, the p-Si amplifier can directly output the difference detected by the p-Si diode as the output voltage difference.

As described above, because the p-Si diode has a small sensitivity between the bright state and the dark state, a plurality of p-Si diodes need to be arranged in parallel so as to increase the sensitivity. In this case, the number of the photo-detection sections 40 disposed in the display panel 11 must be reduced, and therefore, the density of the photo-detection section 40 is decreased, which leads to a problem of lowering the overall sensor resolution of the display panel 11.

In the photodiode 41 made of amorphous silicon (may be referred to as an "a-Si diode" hereinafter), as shown in FIG. 4(B), the amount of electric charges generated in the photodiode 41 when light is incident thereon is much greater than the amount of electric charges generated when there is no incident light. This makes a sufficiently large difference in the voltage Vnet at the node "net" between the bright state and the dark state, which means that there is a sufficiently large sensitivity in the a-Si diode for the bright state and the dark state. On the other hand, in the output amplifier 42 made of amorphous silicon (may be referred to as an "a-Si amplifier" hereinafter), the output voltages in the bright state and in the dark state have not yet been saturated and are still rising at the time of read-out. Therefore, the a-Si amplifier cannot directly output the signal difference detected by the a-Si diode as the output voltage difference.

As described above, because the output voltage of the a-Si amplifier has not yet been saturated at the time of read-out, variation in line widths of the patterns in the photo-detection section 40, the threshold voltage of the output amplifier 42, and the like appears as variations in the output voltage. In order to suppress the variations in the output voltage, the process margin needs to be reduced. However, reducing the process margin makes it difficult to manufacture the display panel 11, resulting in a problem of the lower yield. Also, delaying the time of read-out would allow the a-Si amplifier to directly output the light amount difference detected by the a-Si diode as the output voltage difference. However, that would reduce the number of times that the photo-detection section 40 can output the output voltage (hereinafter referred to as a "sensor frequency"), thereby causing the deterioration in photo-detection performance.

To solve these problems, an a-Si diode is used for the photodiode 41 and a p-Si amplifier is used for the output amplifier 42. In this case, as shown in FIG. 4(C), the a-Si diode has a sufficiently large difference in the voltage Vnet at the node "net" between the bright state and the dark state. This indicates that the a-Si diode has a sufficiently large difference in the generated charges between the bright state and the dark state. The difference in the output voltage of the p-Si amplifier between the bright state and the dark state is small, but the output voltages have been saturated at the time of read-out, and therefore, the p-Si amplifier can output the large difference detected by the a-Si diode directly as the large output voltage difference. As described above, when the a-Si diode is used as the photodiode 41 and the p-Si amplifier is used as the output amplifier 42, the large difference between the bright state and the dark state can be directly output as the large output voltage difference.

The output voltage of the p-Si amplifier can reach the saturation voltage in a shorter period of time as compared with the output of the a-Si amplifier as described above by the virtue of its mobility. The mobility of polycrystalline silicon is hundreds of times higher than the mobility of amorphous silicon. More specifically, the mobility of amorphous silicon is 0.4 cm²/V·sec and the mobility of polycrystalline silicon is 100 to 200 cm²/V·sec. When the output amplifier 42 is formed of polycrystalline silicon having such a high mobility, the ON resistance of the output amplifier 42 becomes smaller. This allows a larger current to flow to the output amplifier 42, thereby causing the output voltage to reach the saturation voltage in a shorter period of time.

Figure 5:
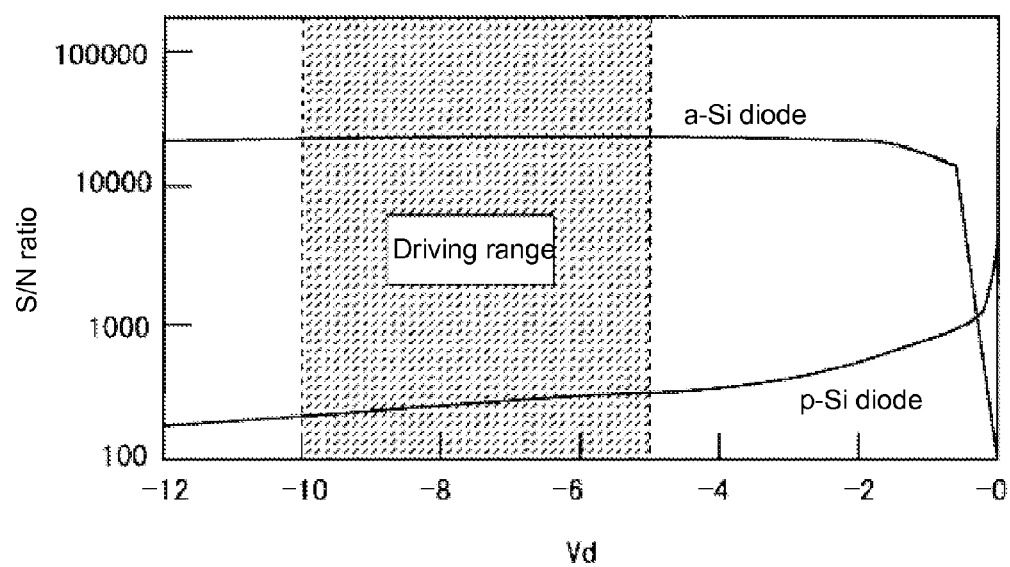
FIG. 5 is a diagram showing a relationship between the S/N ratio of the bright state and the dark state of the photodiode included in the organic EL display device illustrated in FIG. 1 and the reverse-bias voltage applied on the photodiode.
Figure 5:
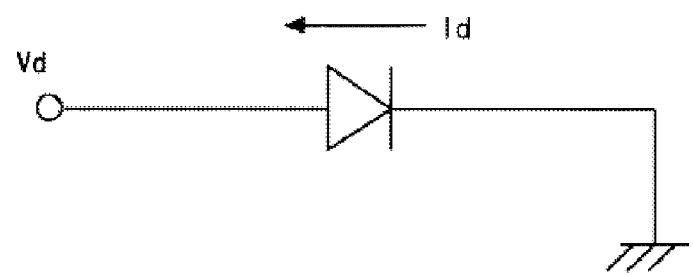

Studies were conducted to find out a relationship between materials and the sensitivity of the photodiode 41 and the findings will be explained hereinafter. FIG. 5 is a chart showing a relationship between the S/N ratio of the photodiode 41 in the bright state and the dark state and the reverse-bias voltage applied on the photodiode 41. Here, the S/N ratio is given by the following formula (1), where Id_photo is the measured amount of the current of the electric charges generated in the photodiode 41 in the bright state, and Id_dark is the measured amount of the current of the electric charges generated in the photodiode 41 in the dark state.

$$S/N \text{ ratio} = Id\_photo/Id\_dark \quad (1)$$

In a range of −10V to −5V, which is the range of the reverse-bias voltage applied to drive the photodiode 41 in the present embodiment (driving range), the S/N ratio of the a-Si diode is about several tens of thousands and remains almost constant. In contrast, the S/N ratio of the p-Si diode is about several hundreds, which is as small as about one in several hundreds parts of the S/N ratio of the a-Si diode, and the S/N ratio changes according to the value of the reverse-bias voltage. This indicates that the a-Si diode is more preferably used for the photodiode 41 in the photo-detection section 40 than the p-Si diode.

Figure 6:
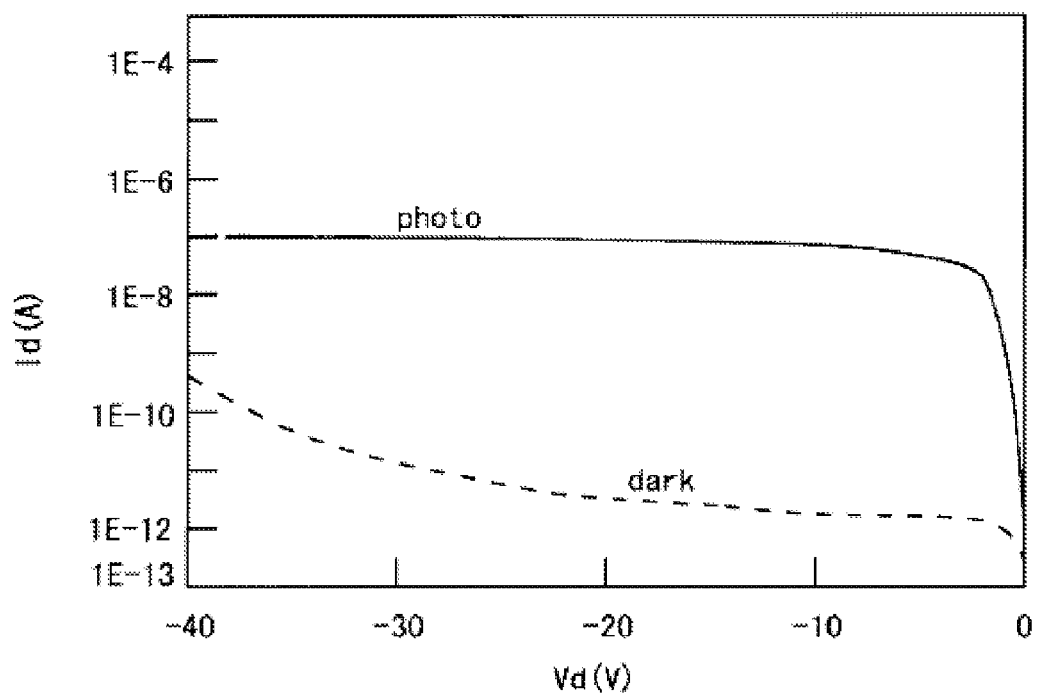
FIG. 6 is a diagram showing current-voltage characteristics of an a-Si diode made of a diode-connection TFT included in the organic EL display device illustrated in FIG. 1.
Figure 6:
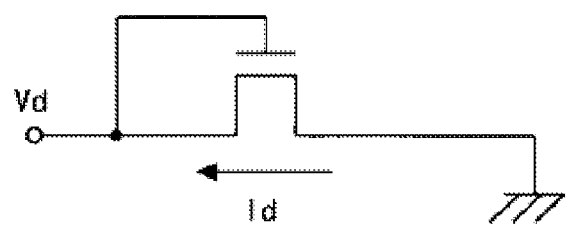

FIG. 6 is a chart showing current-voltage characteristics of an a-Si diode made of the TFT 41 in which the gate terminal and the drain terminal are connected. As shown in FIG. 6, the measured amount of the current flowing to the a-Si diode in the bright state is about 1×10⁻⁷A, which is several thousands through tens of thousands of times higher than the measured amount of the current flowing in the dark state. This also indicates that the a-Si diode has a large difference in photo current between the bright state and the dark state, and is suitably used for the photodiode 41 of the photo-detection section 40.

5. Structure of Display Panel 5.1 Pattern Arrangement of TFT Substrate

A pattern arrangement of the pixel forming section 20 in the display panel 11 shown in FIG. 1 will be explained. FIG. 7(A) is a plan view illustrating a pattern arrangement of the pixel forming section 20 in a TFT substrate 11a. FIG. 7(B) is a plan view illustrating a pattern arrangement of the pixel forming section 20 in an opposite substrate 11b. As shown in FIGS. 7(A) and 7(B), the display panel 11 includes the TFT substrate 11a having the organic EL element 33, and the opposite substrate 11b bonded so as to face the TFT substrate 11a. The TFT substrate 11a includes the selector TFT 31 and the controller TFT 32 for the light-emitting display section 30, and the output amplifier 42 for the photo-detection section 40, which are made of polycrystalline silicon. The opposite substrate 11b includes the TFT 41 that is made of amorphous silicon and that acts as a photodiode of the photo-detection section 40.

The TFT substrate 11a will be explained first. As shown in FIG. 7(A), on a surface of a transparent insulating substrate, a scanning signal line GL and a common voltage supply line COM are formed in parallel with each other with a predetermined spacing in the horizontal direction (horizontal direction in FIG. 7(A)). Also, in the direction perpendicular to the scanning signal line GL and the common voltage supply line COM (vertical direction in FIG. 7(A)), a data signal line SL, a power supply line DD, and a sensor output line OUT are formed in parallel with one another with predetermined spacings in this order from the left of FIG. 7(A). In a region that is between the power supply line DD and the sensor output line OUT and that is above (toward the top of FIG. 7(A)) the scanning signal line GL, the controller TFT 32 is formed. A channel layer 101 of the controller TFT 32 is formed of polycrystalline silicon. A gate electrode 111 projects from a wiring layer 116 formed in parallel with the scanning signal line GL and crosses the channel layer 101. One end of the channel layer 101 is electrically connected to the power supply line DD, and the other end of the channel layer 101 is electrically connected via a wiring layer 131 to a transparent electrode 151 that constitutes a part of the organic EL element 33.

In a region that is between the data signal line SL and the power supply line DD and that is above (toward the top of FIG. 7(A)) the scanning signal line GL, the selector TFT 31 is formed. A channel layer 103 of the selector TFT 31 is also formed of polycrystalline silicon. A gate electrode 115 projects from the scanning signal line GL and crosses the channel layer 103. One end of the channel layer 103 is electrically connected to the data signal line SL, and the other end of the channel layer 103 is electrically connected via the wiring layer 116 to the gate electrode 111 of the controller TFT 32. Also, above the common voltage supply line COM, one electrode 34a that, together with the common voltage supply line COM, forms the capacitor 34 is formed. The one electrode 34a is electrically connected to the wiring layer 116 via a wiring layer 135.

The output amplifier 42 of the photo-detection section 40 is formed in a region that is between the power supply line DD and the sensor output line OUT and that is below (toward the bottom of FIG. 7(A)) the scanning signal line GL. A channel layer 102 of the output amplifier 42 is formed of polycrystalline silicon. One end of the channel layer 102 is electrically connected to the power supply line DD, and the other end of the channel layer 102 is electrically connected to the sensor output line OUT. A gate electrode 112 and a pad electrode 132 that is electrically connected to the gate electrode 112 are disposed above the channel layer 102. On the surface of the pad electrode 132, a columnar portion 141 made of a column-shaped insulating material is formed. The surface of the columnar portion 141 is covered with a transparent metal layer 152. The columnar portion 141 and the transparent metal layer 152 covering the surface thereof are collectively referred to as a connecting member 50.

The transparent electrode 151 that constitutes a part of the organic EL element 33 and that is also a common electrode is formed in a region on the surface of the TFT substrate 11a not including the output amplifier 42. The transparent electrode 151 is also a common electrode. The organic EL element 33 also includes a light-emitting layer and a reflection plate that becomes a common electrode, each laminated on the surface of the transparent electrode 151 in this order. The light-emitting layer and the reflection plate are not shown in FIG. 7(A).

Next, the opposite substrate 11b will be explained. As shown in FIG. 7(B), a sensor reset line RST and a sensor read-out line RW are formed on a surface of a transparent insulating substrate so as to be parallel with each other in the horizontal direction. A gate electrode 114 of the TFT 41 that acts as a photodiode and that is made of amorphous silicon projects from the sensor reset line RST toward the sensor read-out line RW side. A channel layer 121 made of amorphous silicon is formed over the gate electrode 114. One end of the channel layer 121 is electrically connected to the sensor reset line RST by a wiring layer 133 in order to electrically connect the gate terminal to the drain terminal of the TFT 41, and the other end of the channel layer 121 is electrically connected to a wiring layer 134. A wiring layer 113 projects from the sensor read-out line RW toward the sensor reset line RST side. The wiring layer 113 and the wiring layer 134 become electrodes of the capacitor 43, respectively. On the surface of the wiring layer 134, a connecting pad 153 made of a transparent metal film is formed.

5.2 Cross-Sectional Structure of Display Panel

Figure 7:
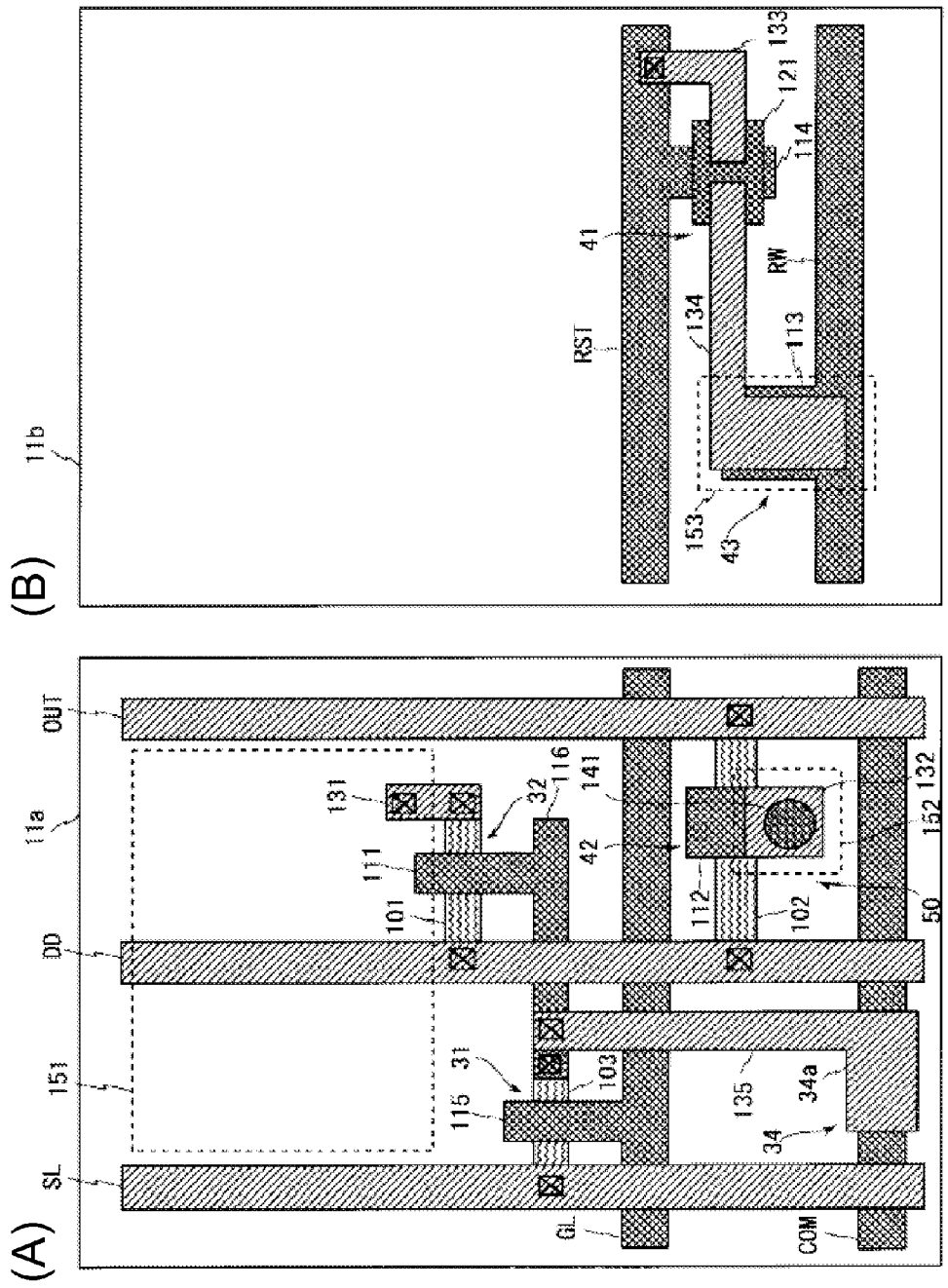
FIG. 7(A) is a plan view showing a pattern arrangement of a pixel forming section in a TFT substrate included in the organic EL display device illustrated in FIG. 1.
FIG. 7(B) is a plan view showing a pattern arrangement of a pixel forming section in an opposite substrate included in the organic EL display device illustrated in FIG. 1.
Figure 8:
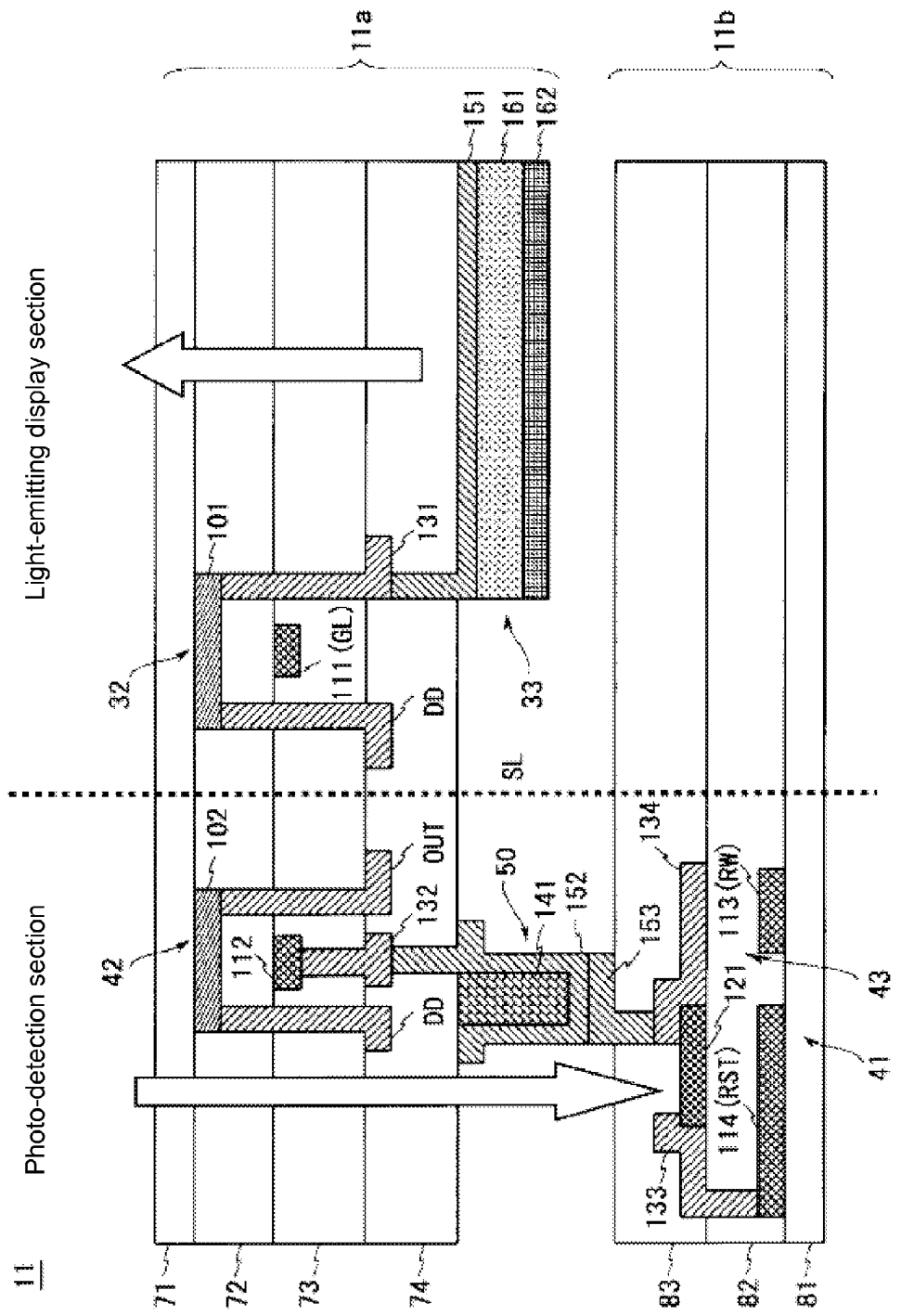
FIG. 8 is a cross-sectional view showing a cross-sectional structure of the display panel illustrated in FIG. 7.

FIG. 8 is a cross-sectional view showing a cross-sectional structure of the display panel 11 shown in FIG. 7. As shown in FIG. 8, the display panel 11 has a structure in which the TFT substrate 11a (upper substrate in FIG. 8) is bonded so as to be placed face-down above the opposite substrate 11b (lower substrate in FIG. 8). The TFT substrate 11a includes a transparent insulating substrate 71 such as a glass substrate. On the substrate 71, the channel layer 101 of the controller TFT 32 for the light-emitting display section 30 and the channel layer 102 of the output amplifier 42 for the photo-detection section 40 are formed by using polycrystalline silicon. A first gate insulating film 72 is formed so as to cover the insulating substrate 71 entirely. The first gate insulating film 72 is made of a silicon nitride (SiNx) film, a silicon oxide (SiO$_2$) film, or the like, for example. On the surface of the first gate insulating film 72, the gate electrode 111 of the controller TFT 32 and the gate electrode 112 of the output amplifier 42 are formed, and a first interlayer insulating film 73 is formed thereon so as to cover the insulating substrate 71 entirely. The gate electrodes 111 and 112 are formed of a metal film made of aluminum (Al), silver (Ag), copper (Cu), tantalum (Ta), molybdenum (Mo), titanium (Ti), or the like, or an alloy film thereof, for example. These metal films are used not only as gate electrodes, but also as wiring layers described later. The first interlayer insulating film 73 is made of a silicon nitride (SiNx) film, a silicon oxide (SiO$_2$) film, or an acrylic resin film. These films are also used as other interlayer insulating films described later.

On the surface of the first interlayer insulating film 73, the power supply line DD electrically connected to the drain terminal of the controller TFT 32, and the wiring layer 131 electrically connected to the source terminal thereof are formed. On the same surface, the power supply line DD and the sensor output line OUT electrically connected to the drain terminal and the source terminal of the output amplifier 42, respectively, and a pad electrode 132 electrically connected to the gate electrode 112 are also formed. Further, a second interlayer insulating film 74 is formed thereon so as to cover the insulating substrate 71 entirely. The organic EL element 33 is formed on the surface of the second interlayer insulating film 74. The organic EL element 33 includes the transparent electrode 151, a light-emitting layer 161, and a reflection plate 162 laminated in this order from the side closer to the surface of the second interlayer insulating film 74. The transparent electrode 151 is electrically connected to the source terminal of the controller TFT 32 via the wiring layer 131. The transparent electrode 151 is formed of a transparent metal film made of indium tin oxide (ITO), indium zinc oxide (IZO), or the like, for example. The light-emitting layer 161 is made of an organic compound. The reflection plate 162 is made of aluminum, silver, or an alloy film thereof, for example.

On the surface of the second interlayer insulating film 74 of the photo-detection section 40, the connecting member 50 electrically connected to the pad electrode 132 is formed. The connecting member 50 includes a circular column-shaped columnar portion 141 made of acrylic resin that can be processed by the photolithography, and a transparent metal layer 152 that covers the surface of the columnar portion 141 and that is electrically connected to the pad electrode 132. The transparent metal layer 152 is made of the same material as that of the transparent electrode 151.

Next, the opposite substrate 11b will be explained. On a surface of a transparent insulating substrate 81 such as a glass substrate, the sensor read-out line RW and the sensor reset line RST are formed. A second gate insulating film 82 is formed thereon so as to cover the insulating substrate 81 entirely. The channel layer 121 of the TFT 41 that acts as the photodiode of the photo-detection section 40 is formed on the surface of the second gate insulating film 82 by using amorphous silicon. One end of the channel layer 121 is electrically connected to the sensor reset line RST by the wiring layer 133. The other end of the channel layer 121 is electrically connected to one end of the wiring layer 134. The other end of the wiring layer 134 and the sensor read-out line RW constitute electrodes of the capacitor 43 of the photo-detection section 40. Further, a third interlayer insulating film 83 is formed so as to cover the insulating substrate 81 entirely. On the surface of the third interlayer insulating film 83, the connecting pad 153 made of a transparent metal film and electrically connected to the wiring layer 134 is formed. The connecting pad 153 is electrically connected to the transparent metal layer 152 disposed on the top face of the connecting member 50 formed in the TFT substrate 11a. In this way, one terminal (which corresponds to a cathode terminal of the photodiode) of the TFT 41 and one electrode of the capacitor 43 connected to the wiring layer 134, both formed in the opposite substrate 11b, are electrically connected to the gate electrode 112 of the output amplifier 42 formed in the TFT substrate 11a via the connecting member 50. The connection point thereof becomes the node "net" shown in FIG. 2. The TFT substrate 11a also includes a selector TFT having a channel layer made of polycrystalline silicon, but the configuration thereof is same as that of the controller TFT, and therefore, it is not shown in FIG. 8.

As described above, in the display panel 11, the selector TFT 31 and the controller TFT 32 of the light-emitting display section 30 and the output amplifier 42 of the photo-detection section 40 are made of polycrystalline silicon and formed in the TFT substrate 11a, whereas the TFT 41 that acts as the photodiode is made of amorphous silicon and formed in the opposite substrate 11b. This way, the TFT substrate 11a and the opposite substrate 11b can be respectively manufactured with ease. Light emitted from the organic EL element 33 is extracted from the surface of the TFT substrate 11a on the insulating substrate 71 side, which makes the display panel 11 a bottom-emission type.

5.3 Connection Method by Connecting Member

A method of electrically connecting the TFT substrate 11a and the opposite substrate 11b by the connecting member 50 will be explained. First, a formation method of the connecting member 50 will be explained. After the second interlayer insulating film 74 is formed in the TFT substrate 11a, an acrylic resin film is applied thereon. Next, a resist pattern is formed by photolithography and then etching of the resin film is conducted using the resist pattern as a mask. As a result, the columnar portion 141 is formed on the surface of the second interlayer insulating film 74. Next, a transparent metal film is formed so as to cover the columnar portion 141. The transparent metal film is patterned into a desired shape by photolithography, thereby forming the transparent metal layer 152. When the cell thickness is set to 3 μm, for example, the height of the connecting member is set to about 3.5 μm.

Meanwhile, a transparent metal film is also formed on the surface of the third interlayer insulating film 83 formed in the opposite substrate 11b. The film is patterned into a desired shape by photolithography to form the connecting pad 153 in a position where it will be connected to the connecting member 50.

Next, an alignment mark formed in the opposite substrate 11b is aligned to an alignment mark formed in the TFT substrate 11a so as to align the connecting pad 153 to the connecting member 50. The opposite substrate 11b is then bonded to the TFT substrate 11a. At this time, the connecting member 50 shrinks and the cell thickness becomes 3 μm. In this case, the connecting member 50 also acts as a spacer that maintains a predetermined spacing between the TFT substrate 11a and the opposite substrate 11b.

In positioning the opposite substrate 11b to the TFT substrate 11a, an alignment margin of about 5 μm on either side is needed, and therefore, the connecting pad 153 needs to be made larger than the connecting member 50 by about 5 μm on either side. In this embodiment, the TFT substrate 11a and the opposite substrate 11b were bonded together after the connecting member 50 was formed on the TFT substrate 11a, but the TFT substrate 11a and the opposite substrate 11b may also be bonded together after forming the connecting member 50 on the opposite substrate 11b and forming the connecting pad 153 on the TFT substrate.

5.4 Reference Example of Organic EL Display Panel

Figure 9:
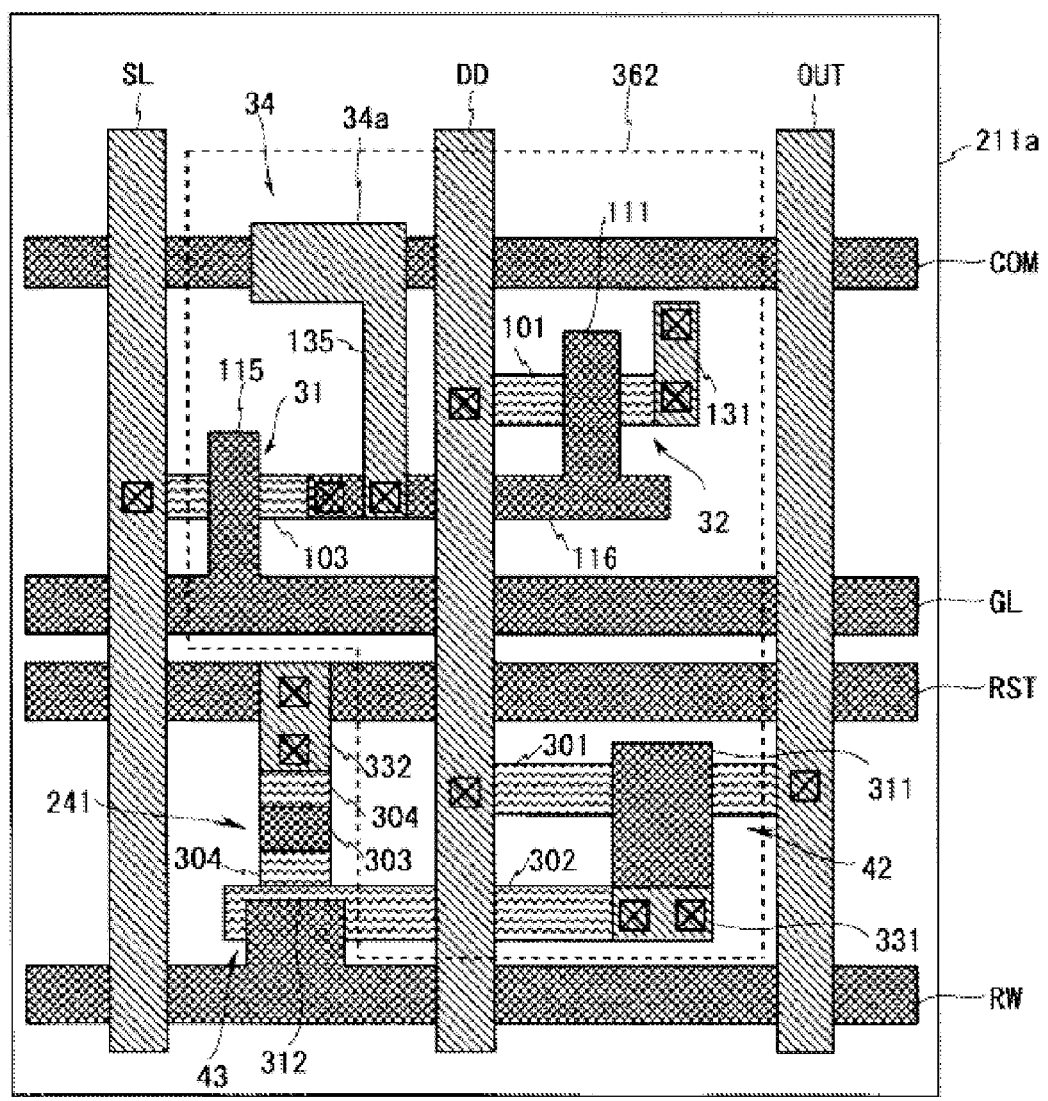
FIG. 9 is a plan view showing a pattern arrangement of a pixel forming section in a TFT substrate of a display panel illustrated as a reference example.

FIG. 9 is a plan view showing a pattern arrangement of the pixel forming section 20 in a TFT substrate 211a of a display panel illustrated as a reference example. Some of the components of the TFT substrate 211a illustrated in FIG. 9 are same as those of the TFT substrate 11a of the display panel 11, and therefore share the same reference characters. The following explanations will be made mainly for the differences between the two.

In the TFT substrate 211a, the selector TFT 31 and the controller TFT 32 of the light-emitting display section 30, and the output amplifier 42 and a PIN diode 241 of the photo-detection section 40 are formed of polycrystalline silicon. The TFT substrate 211a differs from the TFT substrate 11a in that the PIN diode 241 is used as the photodiode of the photo-detection section 40. When materials of respective elements are same as those of the elements formed in the TFT substrate 11a, the descriptions of such materials will be omitted.

As shown in FIG. 9, the TFT substrate 211a differs from the TFT substrate 11a in that the sensor reset line RST and the sensor read-out line RW are also formed to be parallel with the scanning signal line GL formed in the horizontal direction. Specifically, the sensor reset line RST and the sensor read-out line RW are formed below (toward the bottom of FIG. 9) the scanning signal line GL, and the common voltage supply line COM is formed above (toward the top of FIG. 9) the scanning signal line.

The selector TFT 31 is formed in a region that is between the data signal line SL and the power supply line DD and between the scanning signal line GL and the common voltage supply line COM. The controller TFT 32 is formed in a region that is between the power supply line DD and the sensor output line OUT and between the scanning signal line GL and the common voltage supply line COM. The configurations and connections of the selector TFT 31 and the controller TFT 32 are same as those in FIG. 7(A), and therefore, they will not be explained here. Also, the arrangement and the connection of the capacitor 34 are same as those in FIG. 7(A), and therefore, they will not be explained here. Unlike the TFT substrate 11a, the drain terminal of the controller TFT 32 is electrically connected to a reflection plate 362 via the wiring layer 131.

The output amplifier 42 of the photo-detection section 40 is formed in a region that is between the sensor reset line RST and the sensor read-out line RW and between the power supply line DD and the sensor output line OUT. A channel layer 301 of the output amplifier 42 is formed of polycrystalline silicon and arranged so as to be parallel with the sensor reset line RST. Further, a wiring layer 302 made of polycrystalline silicon is formed in a region between the channel layer 301 and the sensor read-out line RW so as to be parallel with the sensor read-out line RW. A gate electrode 311 is formed so as to cross the channel layer 301 of the output amplifier 42 and is electrically connected to one end of the wiring layer 302. On the gate electrode 311 located above the one end of the wiring layer 302, a wiring layer 331 that becomes the node "net" is formed.

The PIN diode 241 made of polycrystalline silicon is formed in a region that is between the data signal line SL and the power supply line DD and between the sensor reset line RST and the sensor read-out line RW. The PIN diode 241 is a diode configured to have impurity layers 304 that include n-type and p-type impurities, respectively, and that sandwich an intrinsic silicon layer 303 therebetween. One impurity layer 304 is electrically connected to the sensor reset line RST by a wiring layer 332. The other impurity layer 304 is electrically connected to the wiring layer 302. The other end of the wiring layer 302 becomes one electrode of the capacitor 43 that causes a large increase in the potential at the node "net." The other electrode of the capacitor 43 is constituted by an electrode 312 projecting from the sensor read-out line RW toward the PIN diode 241 side.

In a region not including the PIN diode 241 of the photo-detection section 40, the reflection plate 362 that is made of aluminum, silver, or an alloy film thereof, for example, and that constitutes a part of the organic EL element 33 is formed. On the surface of the reflection plate 362, a light-emitting layer and a transparent electrode that is also a common electrode are laminated in this order. The light-emitting layer is made of an organic compound and the transparent electrode is formed of a transparent metal film made of indium tin oxide (ITO), indium zinc oxide (IZO), or the like, for example. However, the light-emitting layer and the transparent electrode are not shown in FIG. 9. Also, because an opposite substrate does not include any elements that constitute the light-emitting display section 30 or the photo-detection section 40, a plan view of the opposite substrate is not shown in the figure.

Figure 10:
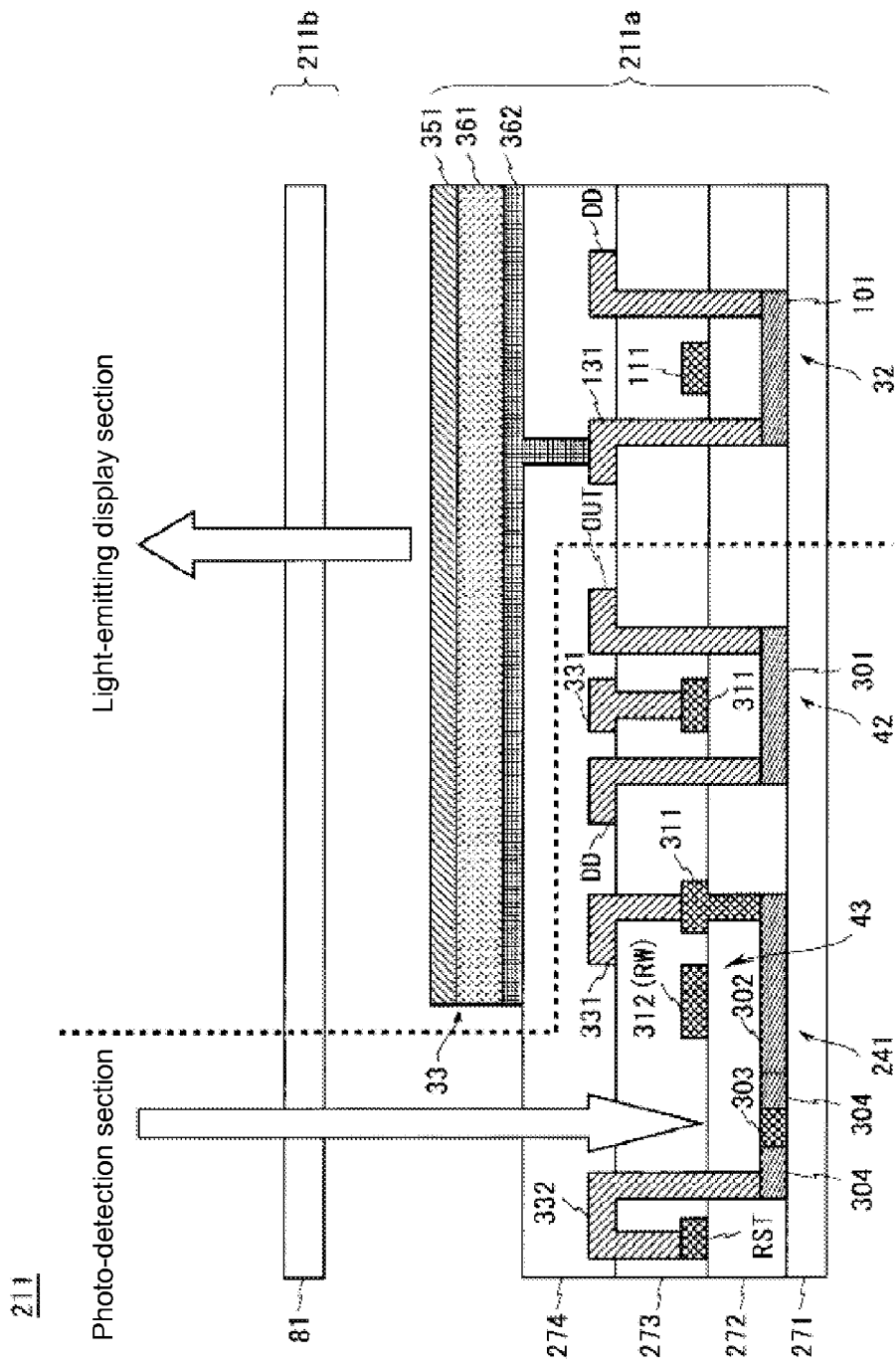
FIG. 10 is a cross-sectional view showing a cross-sectional structure of the display panel illustrated in FIG. 9.

FIG. 10 is a cross-sectional view showing a cross-sectional structure of a display panel 211 including the TFT substrate 211a illustrated in FIG. 9. As shown in FIG. 10, in the display panel 211, the TFT substrate 211a is disposed on the lower side of FIG. 10. The opposite substrate 211b is placed face-down above the TFT substrate 221a. The TFT substrate 211a has an insulating substrate 271 such as a glass substrate, and on the surface of the substrate, the channel layers 101 and 301 of the controller TFT 32 and the output amplifier 42, the PIN diode 241 that acts as the photodiode, and the wiring layer 302 are formed using polycrystalline silicon. The wiring layer 302 is electrically connected to the PIN diode 241, and also acts as one electrode of the capacitor 43. A gate insulating film 272 is formed so as to cover the insulating substrate 271 entirely.

On the surface of the gate insulating film 272, gate electrodes 111 and 311 of the controller TFT 32 and the output amplifier 42, the sensor read-out line RW that also acts as the other electrode of the capacitor 43 that causes a large increase in a voltage of the node "net", and the sensor reset line RST are formed. A first interlayer insulating film 273 is formed thereon so as to cover the insulating substrate 271 entirely. On the surface of the first interlayer insulating film 273, the power supply lines DD that are electrically connected to the channel layers 101 and 301 of the controller TFT 32 and the output amplifier 42, the sensor output line OUT, the wiring layer 331 that becomes the node "net", and a wiring layer 332 are formed. The wiring layer 332 connects one of the impurity layers 304 that becomes an anode terminal of the PIN diode 241 to the sensor reset line RST.

Further, a second interlayer insulating film 274 is formed thereon so as to cover the insulating substrate 271 entirely. On the surface of the second interlayer insulating film 274, the organic EL element 33 is formed. The organic EL element 33 includes a reflection plate 362, a light-emitting layer 361, and a transparent electrode 351 laminated in this order from the side closer to the surface of the second interlayer insulating film 274. The reflection plate 362 is electrically connected to the source terminal of the controller TFT 32 via the wiring layer 131.

As described above, in the display panel 211, the channel layer of the selector TFT 31, the channel layer 101 of the controller TFT 32, the channel layer 301 of the output amplifier 42, and the PIN diode 241 of the pixel forming section 20 are all made of polycrystalline silicon, unlike the display panel 11. Therefore, all of them are formed on the TFT substrate 211a. Also, light emitted from the organic EL element 33 is extracted from the surface of the TFT substrate 211a on the opposite substrate 211b side, which makes the display panel 211 a top emission type.

6. Simulation Result

Figure 11:
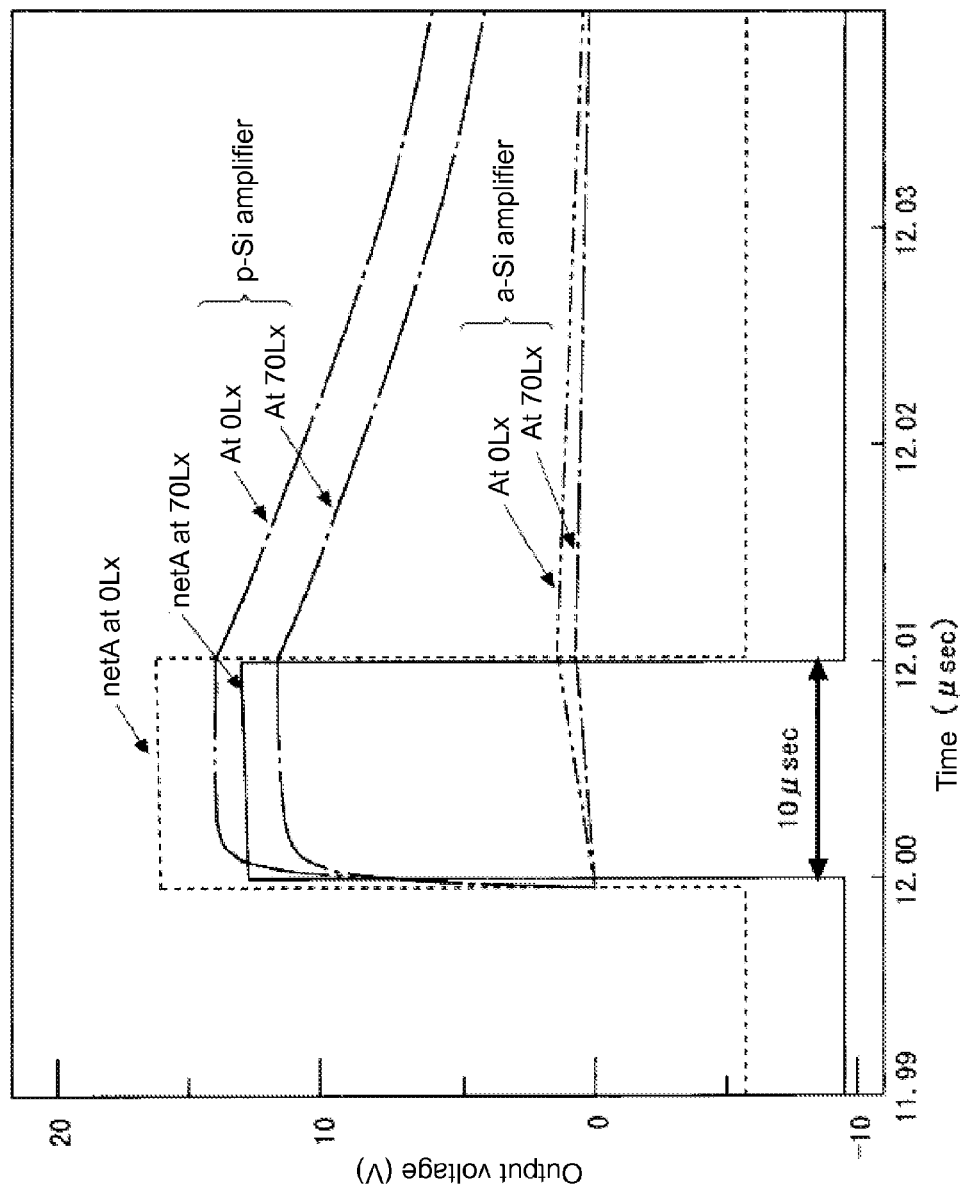
FIG. 11 is a diagram showing the simulation result of output voltages Vout of an a-Si amplifier and a p-Si amplifier in the bright state and the dark state.

Explained below is the result of the simulation conducted for the output voltage Vout of the a-Si amplifier and the output voltage Vout of the p-Si amplifier when the a-Si diode is used as the photodiode 41, and the a-Si amplifier and the p-Si amplifier are used as the output amplifier 42 in the photo-detection section 40. FIG. 11 is a chart showing the simulation result of the output voltages Vout of the a-Si amplifier and the p-Si amplifier in the bright state and in the dark state. The conditions of the simulation are as follows:

L/W of the photodiode 41: 4/50 μm
Capacitance of the capacitor 43: 0.25 pf
L/W of the output amplifier 42: 4/60 μm
Reset voltage Vrst: −10V→−5V (high-level duration: 10 μsec)
Read-out voltage Vrw: −16V→+24V (high-level duration: 10 μsec)
Power supply voltage Vdd: DC+15V
Temperature: 27° C.
Illuminance: 0 Lx (in the dark state), 70 Lx (in the bright state)

As shown in FIG. 11, immediately before the read-out voltage Vrw applied to the sensor read-out line RW is raised to its higher level, the voltage Vnet of the node "net" is −5.82V in the dark state (at 0 Lx), and −9.84V in the bright state (at 70 Lx). Once the read-out voltage Vrw is raised from −16V to +24V, the voltage Vnet of the node "net" becomes about +16.5V at 0 Lx, and becomes about +13V at 70 Lx. The output voltage of the p-Si amplifier reaches the saturation voltage in several pt-seconds, and at the time of read-out (when the read-out voltage Vrw returns to the lower level), the output voltage Vout at 0 Lx becomes +14.48V, and the output voltage at 70 Lx becomes +11.67V. This means that there is a large difference (dynamic range) of 2.81V in the output voltage of the p-Si amplifier between the bright state and the dark state.

In contrast, the output voltage Vout of the a-Si amplifier has not yet reached the saturation voltage at the time of the read-out, and therefore, at the time of the read-out, the output voltage Vout at 0 Lx is +1.40V, and the output voltage Vout at 70 Lx is +0.78V. The dynamic range of the a-Si amplifier therefore becomes 0.62V, which is smaller than the dynamic range of the p-Si amplifier.

This simulation result shows that the dynamic range of the output voltage Vout of the output amplifier 42 becomes greater by as much as 2.19V when the p-Si amplifier is used as compared to when the a-Si amplifier is used, thereby indicating that the p-Si amplifier is more preferably used for the output amplifier 42 of the photo-detection section 40 than the a-Si amplifier.

7. Photodiode Arrangement

Figure 12:
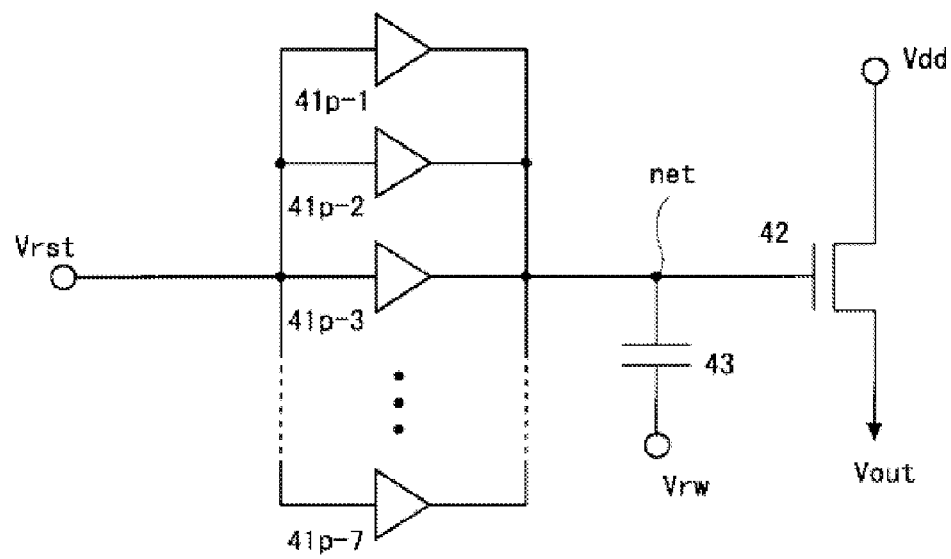
FIG. 12(A) is a circuit diagram showing an equivalent circuit of a photo-detection section using a p-Si diode as the photodiode.
FIG. 12(B) is a diagram showing an arrangement of each element of the photo-detection section illustrated in FIG. 12(A).
Figure 12:
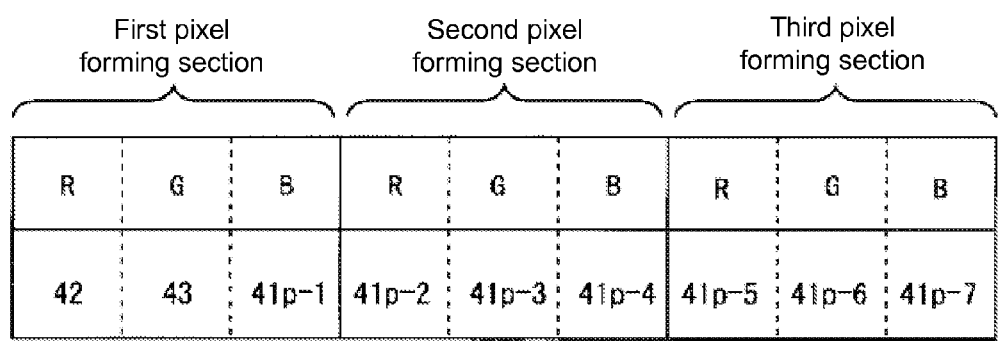

A configuration of the photo-detection section 40 will be explained. FIG. 12(A) is a circuit diagram showing an equivalent circuit of the photo-detection section 40 using the p-Si diode as the photodiode 41. FIG. 12(B) is a diagram showing an arrangement of each element of the photo-detection section 40 shown in FIG. 12(A).

As described above, because the p-Si diode has a low sensitivity to visible light, the difference between the voltage Vnet of the node "net" in the bright state and that in the dark state is small. Therefore, it is necessary to connect a plurality of p-Si diodes in parallel so as to increase the difference in the voltage Vnet between the bright state and the dark state. As shown in FIG. 12(A), seven p-Si diodes 41p-1 to 41p-7 are connected in parallel between the sensor reset line RST and the node "net", for example. The capacitor 43 and the output amplifier 42 are connected in the same way as the equivalent circuit shown in FIG. 2, and therefore, the explanation thereof will be omitted.

As shown in FIG. 12(B), each pixel forming section 20 arranged in the display panel 11 includes three sub-pixels of red (R), green (G), and blue (B). The output amplifier 42 is disposed in the R sub-pixel of the first pixel forming section 20. The capacitor 43 is disposed in the G sub-pixel of the first pixel forming section 20. The seven p-Si diodes 41p-1 to 41p-7 are disposed in seven sub-pixels from the B sub-pixel of the first pixel forming section 20 through the B sub-pixel of the third pixel forming section 20, respectively. As described above, when the p-Si diodes 41p-1 to 41p-7 are used as the photodiode 41, it takes three pixel forming sections 20 to provide one photo-detection section 40.

Figure 13:
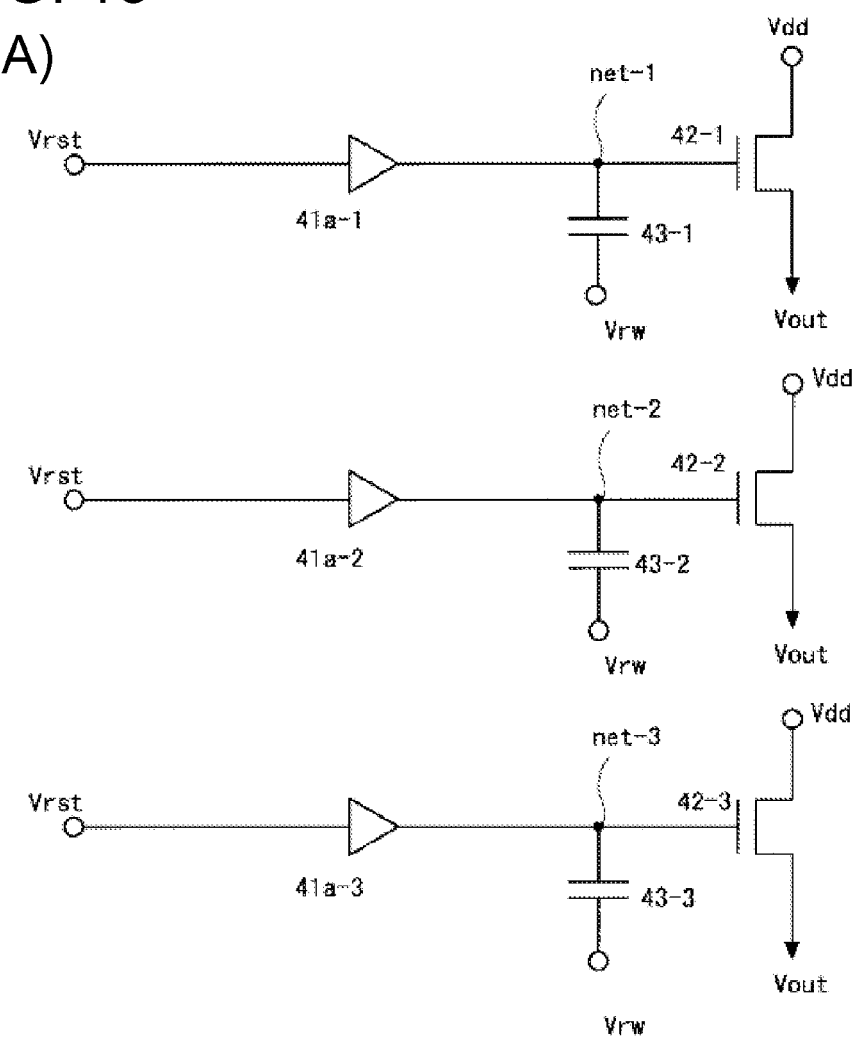
FIG. 13(A) is a circuit diagram showing an equivalent circuit of a photo-detection section using an a-Si diode as the photodiode.
FIG. 13(B) is a diagram showing an arrangement of each element of the photo-detection section illustrated in FIG. 13(A).
Figure 13:
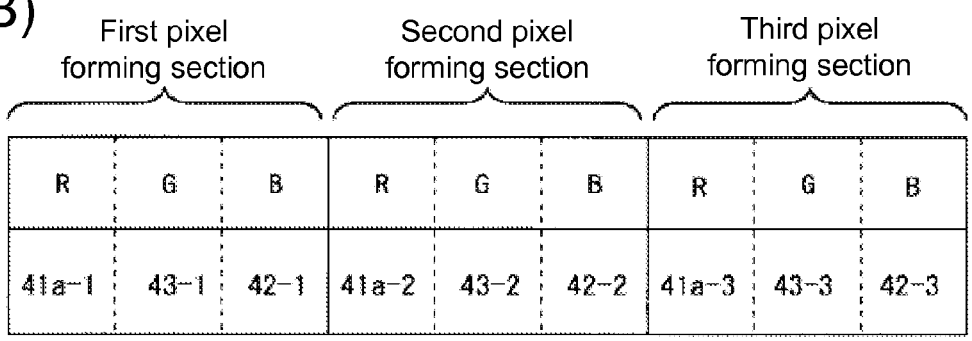

Another configuration of the photo-detection section 40 will be explained. FIG. 13(A) is a circuit diagram showing an equivalent circuit of the photo-detection section 40 using the a-Si diode as the photodiode 41. FIG. 13(B) is a diagram showing an arrangement of each element of the photo-detection section 40 shown in FIG. 13(A). As described above, because the a-Si diode has a high sensitivity to visible light, the difference in the voltage Vnet of the node "net" between the bright state and the dark state becomes large. Therefore, as shown in FIG. 13(A), the photo-detection section 40 has one a-Si diode 41a-1 connected between the sensor read-out line RW and the node "net." A capacitor 43-1 and an output amplifier 42-1 connected to the a-Si diode 41a-1 are connected in the same way as the equivalent circuit shown in FIG. 2, and therefore, the explanation thereof will be omitted. Also, the a-Si diodes 41a-2 and 41a-3 are connected in the same way, and therefore, the explanation thereof will be omitted.

As shown in FIG. 13(B), each pixel forming section 20 of the display panel includes three sub-pixels of red (R), green (G), and blue (B). The output amplifier 42-1 is disposed in the B sub-pixel of the first pixel forming section 20. The capacitor 43-1 is disposed in the G sub-pixel of the first pixel forming section 20. The a-Si diode 41a-1 is disposed in the R sub-pixel of the first pixel forming section 20. In this way, all of the elements that constitute one photo-detection section 40 are disposed in the first pixel forming section 20. Similarly, another photo-detection section 40 is disposed in the second pixel forming section 20, and another photo-detection section 40 is disposed in the third pixel forming section 20.

As described above, one photo-detection section 40 is disposed in every pixel forming section 20. The density of the photo-detection sections 40 disposed in the display panel 11 can therefore be increased threefold as compared with the case shown in FIG. 12. Also, because the difference in signal strength between the bright state and the dark state is larger in the a-Si diode than in the p-Si diode, the light-receiving time can be shortened by converting a part of this high sensitivity to the light-receiving time. Therefore, the read-out interval for reading out the voltage Vnet of the node "net" can be shortened, resulting in a higher sensor frequency. Additionally, because of this high sensitivity, the read-out voltage Vrw can be lowered, and the power consumption of the organic EL display device 10 can therefore be reduced.

8. Effects

According to the above-mentioned embodiments, when the TFT 41 that acts as the photodiode of the photo-detection section 40 is formed of amorphous silicon, and the output amplifier 42 is formed of polycrystalline silicon, the sensitivity of the TFT 41 between the bright state and the dark state can be increased, and at the same time, the output voltage of the output amplifier 42 can be saturated in a short period of time. This allows the photo-detection section 40 to directly output the large signal difference between the bright state and the dark state detected by the TFT 41, and thereby improves the accuracy for detecting a touch position on a screen displayed on the display panel 11 in the organic EL display device 10.

Also, when the TFT 41 is formed of amorphous silicon, the sensitivity of the TFT 41 for the bright state and the dark state becomes larger than that of the one made of polycrystalline silicon, and therefore, the light-receiving time can be shortened by converting a part of this high sensitivity to the light-receiving time. This makes it possible to shorten the read-out interval, resulting in the higher sensor frequency of the photo-detection section 40. Additionally, the large sensitivity of the TFT 41 formed of amorphous silicon for the bright state and the dark state can be used to lower the read-out voltage Vrw that is output from the sensor row driver circuit 14. This leads to the reduction of the power consumption of the organic EL display device 10.

9. Other

Figure 14:
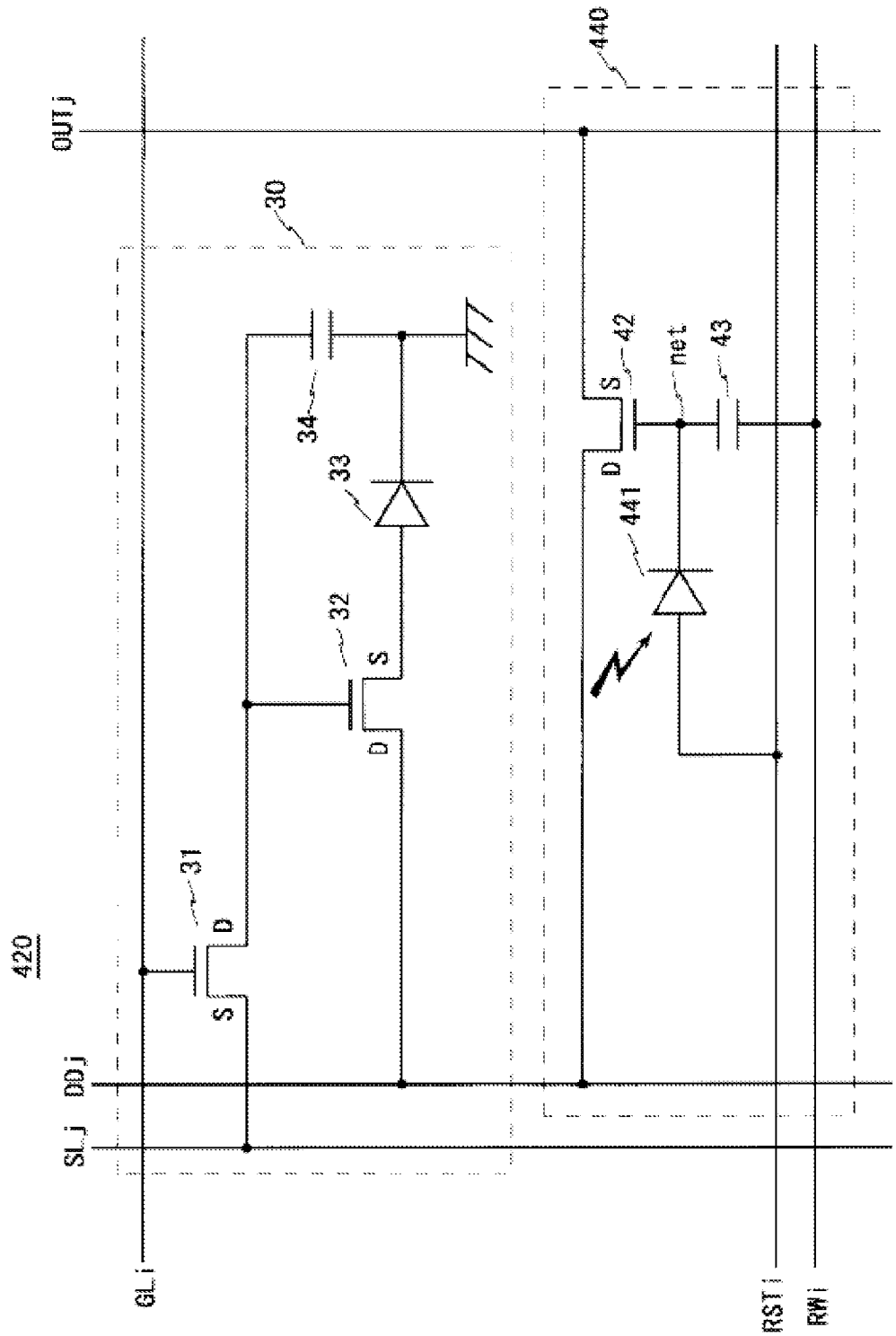
FIG. 14 is an equivalent circuit of a pixel forming section including a photo-detection section including a PIN diode.

In the embodiments of the present invention, a PIN diode made of amorphous silicon may be used instead of the TFT 41 that acts as the photodiode of the photo-detection section 40 shown in FIG. 2. FIG. 14 is an equivalent circuit of a pixel forming section 420 including a photo-detection section 440 that has a PIN diode 441. As shown in FIG. 14, an anode terminal of the PIN diode 441 is connected to the sensor reset line RST, and a cathode terminal is connected to the node "net." The configurations of the output amplifier 42 and the capacitor 43 are same as the configurations of the photo-detection section 40 shown in FIG. 2, and therefore, the same reference characters as those of the photo-detection section 40 shown in FIG. 2 are commonly used, and the explanation thereof is omitted. Also, the configuration of the light-emitting display section 30 is same as the configuration of the light-emitting display section 30 shown in FIG. 2, and therefore, the same reference characters as those of the light-emitting display section 30 shown in FIG. 2 are commonly used, and the explanation thereof is omitted.

The selector TFT 31 and the controller TFT 32 included in the light-emitting display section 30, the TFT 42 that acts as the output amplifier, and the TFT 41 that acts as the photodiode shown in FIGS. 2 and 14 have been all described as n-channel type TFTs, but they may also be p-channel type TFTs. The display device may be a liquid crystal display device. The effects similar to the case of the organic EL display device 10 can be obtained for a photo-detection section disposed in a liquid crystal display device.

INDUSTRIAL APPLICABILITY

The present invention can be applied to display devices including a display panel having a photodetector that detects a touch position of a finger, a pen, or the like. The present invention is particularly suitable for display devices including an organic EL display panel or a liquid crystal display panel.

DESCRIPTION OF REFERENCE CHARACTERS 10 organic EL display device
11 display panel
12 display scanning signal line driver circuit
13 display data signal line driver circuit
14 sensor row driver circuit
15 sensor output read-out circuit
20 pixel forming section
30 light-emitting display section
33 organic EL element
40 photo-detection section
41 TFT (photodiode)
42 output amplifier
43 capacitor
50 connecting member
141 columnar portion
151 transparent electrode
152 transparent metal layer

The invention claimed is:

1. A display device that is capable of detecting a touch position, comprising:
   a display panel including a plurality of image display sections that display an image at a brightness corresponding to image data, and a plurality of photo-detection sections that generate a signal corresponding to an amount of received light;
   a display driver circuit that writes a signal corresponding to the image data in the image display sections; and
   a sensor driver circuit that reads the signal corresponding to the amount of the received light from the photo-detection sections,
   wherein each of the photo-detection sections includes a photodiode that generates electric charges corresponding to an incident light amount, a capacitor that accumulates the electric charges generated in the photodiode and that retains a voltage corresponding to the accumulated electric charge amount, and a thin film transistor that outputs an output signal based on the voltage retained by the capacitor, wherein the photodiode is made of a semiconductor film having a higher photosensitivity than that of a semiconductor film included in the thin film transistor, wherein the thin film transistor is made of a semiconductor film having a higher mobility than that of the semiconductor film included in the photodiode, wherein said display panel comprises a first substrate and a second substrate that are bonded to face each other, wherein the thin film transistor is formed on the first substrate and the photodiode is formed on the second substrate, wherein the thin film transistor and the photodiode are electrically connected by a conductive connecting member formed between the first substrate and the second substrate, wherein the connecting member comprises a columnar portion made of an insulating material and a first conductive film formed on a surface of the columnar portion, and wherein the columnar portion maintains a predetermined spacing between the first substrate and the second substrate by its height.

2. The display device according to claim 1, wherein the semiconductor film included in the photodiode is an amorphous semiconductor film, and wherein the semiconductor film included in the thin film transistor is a polycrystalline semiconductor film.

3. The display device according to claim 1, wherein said image display section comprises a display element, part of which is formed of a second conductive film made of a same material as that of the first conductive film.

4. The display device according to claim 1, wherein the image display section comprises three sub-pixels that display images in red, green, and blue, respectively, and wherein the three sub-pixels respectively include said photodiode, said thin film transistor, and said capacitor.

5. The display device according to claim 1, wherein the photodiode is a thin film transistor in which a control terminal and one conductive terminal constitute an anode terminal and the other conductive terminal is a cathode terminal.

6. The display device according to claim 1, wherein said display panel is an organic EL display panel.

7. The display device according to claim 1, wherein said display panel is a liquid crystal display panel.

* * * * *